United States Patent
Liu et al.

(10) Patent No.: US 12,267,065 B2
(45) Date of Patent: Apr. 1, 2025

(54) ACOUSTIC WAVE FILTER WITH OVERTONE MODE RESONATORS

(71) Applicant: Skyworks Global Pte. Ltd., Singapore (SG)

(72) Inventors: Jiansong Liu, Fremont, CA (US); Kwang Jae Shin, Yongin (KR); Alexandre Augusto Shirakawa, Cardiff by the Sea, CA (US); Yiliu Wang, Irvine, CA (US)

(73) Assignee: Skyworks Global Pte. Ltd., Singapore (SG)

( * ) Notice: Subject to any disclaimer, the term of this patent is extended or adjusted under 35 U.S.C. 154(b) by 245 days.

(21) Appl. No.: 17/651,620

(22) Filed: Feb. 18, 2022

(65) Prior Publication Data
US 2022/0321100 A1  Oct. 6, 2022

Related U.S. Application Data

(60) Provisional application No. 63/168,568, filed on Mar. 31, 2021, provisional application No. 63/168,501, filed on Mar. 31, 2021.

(51) Int. Cl.
| | |
|---|---|
| *H03H 9/205* | (2006.01) |
| *H03F 3/19* | (2006.01) |
| *H03H 9/13* | (2006.01) |
| *H03H 9/56* | (2006.01) |
| *H04B 1/40* | (2015.01) |

(52) U.S. Cl.
CPC ............... *H03H 9/568* (2013.01); *H03F 3/19* (2013.01); *H03H 9/13* (2013.01); *H03H 9/205* (2013.01); *H04B 1/40* (2013.01); *H03F 2200/451* (2013.01)

(58) Field of Classification Search
CPC  H03H 9/17; H03H 9/205; H03H 9/25; H03H 9/76; H03H 9/58; H03H 9/125; H01P 7/10; H01P 7/00
See application file for complete search history.

(56) References Cited

U.S. PATENT DOCUMENTS

| | | |
|---|---|---|
| 6,888,424 B2 | 5/2005 | Takeuchi et al. |
| 7,267,009 B2 | 9/2007 | Liu et al. |
| 7,561,010 B2 | 7/2009 | Hikita et al. |
| 7,719,388 B2 | 5/2010 | Schmidhammer |

(Continued)

FOREIGN PATENT DOCUMENTS

| | | |
|---|---|---|
| JP | 3860695 | 12/2006 |
| JP | 2009-027554 | 2/2009 |

(Continued)

OTHER PUBLICATIONS

Aigner et al., "Pushing BAW beyond 'known' frontiers: Higher, wider, smaller, cooler", Mar. 2018.

(Continued)

*Primary Examiner* — Tu X Nguyen
(74) *Attorney, Agent, or Firm* — Knobbe, Martens, Olson & Bear, LLP

(57) ABSTRACT

Aspects of this disclosure relate to acoustic wave filters with bulk acoustic wave resonators configured to excite an overtone mode as a main mode. A bulk acoustic wave resonator of the filter can include a plurality of stacked piezoelectric layers positioned between a pair of electrodes.

20 Claims, 23 Drawing Sheets

(56) References Cited

U.S. PATENT DOCUMENTS

| | | |
|---|---|---|
| 8,525,619 B1 | 9/2013 | Olsson et al. |
| 9,679,765 B2 | 6/2017 | Larson, III et al. |
| 9,941,857 B1 | 4/2018 | Olsson et al. |
| 2022/0321095 A1 | 10/2022 | Liu et al. |
| 2022/0321101 A1 | 10/2022 | Liu et al. |

FOREIGN PATENT DOCUMENTS

| | | |
|---|---|---|
| JP | 2009027554 A * | 2/2009 |
| JP | 4784815 | 10/2011 |
| WO | WO 2021/062421 | 4/2021 |

OTHER PUBLICATIONS

Ballandras et al., "High overtone bulk acoustic resonators: application to resonators, filters and sensors", Proceedings of the Acoustics 2012 Nantes Conference, pp. 3112-3117, Apr. 2012.

Larson et al., "Characterization of reversed c-axis AlN thin films", Oct. 2010.

Pijolat et al., "Mode conversion in high overtone bulk acoustic wave resonators", IEEE Conference Paper May 2009.

Plessky et al., "Laterally excited bulk wave resonators (XBARs) based on thin lithium niobate platelet for 5GHz and 13 GHz filters", IEEE/MTT-S International Microwave Symposium, pp. 512-515, 2019.

U.S. Appl. No. 17/651,632, filed Feb. 18, 2022, Acoustic Wave Filter With Overtone Mode Resonator and Fundamental Mode Resonator.

* cited by examiner

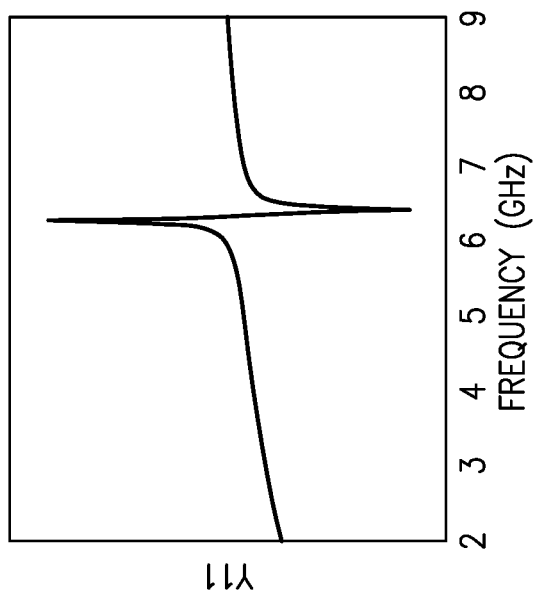
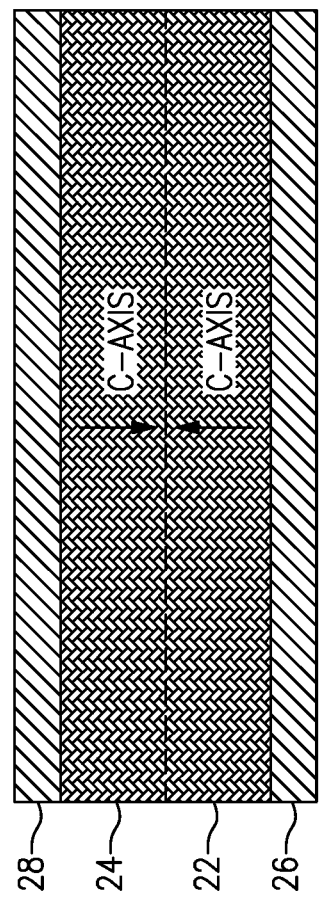
FIG.3B
FIG.3A

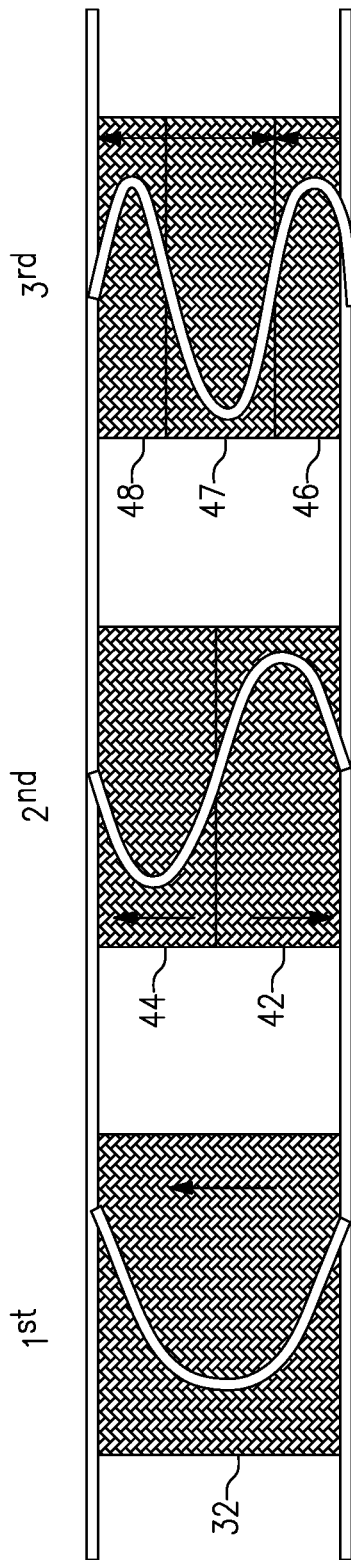

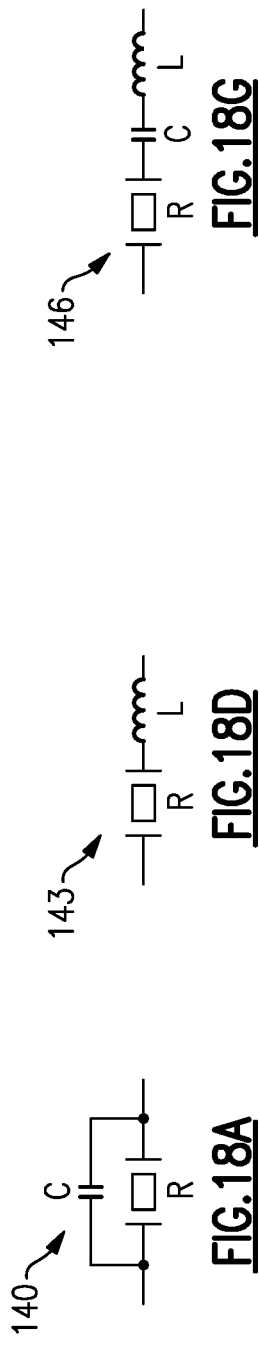
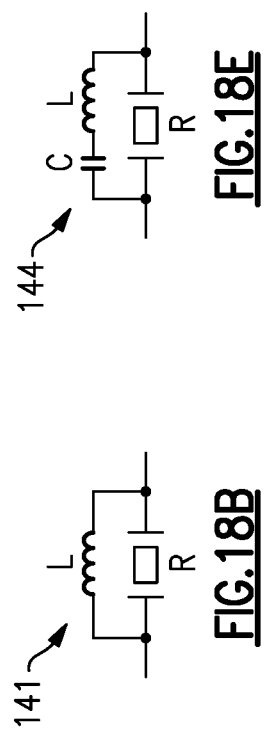
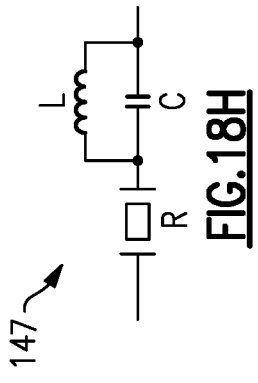
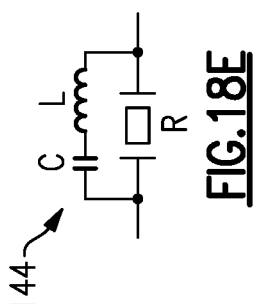
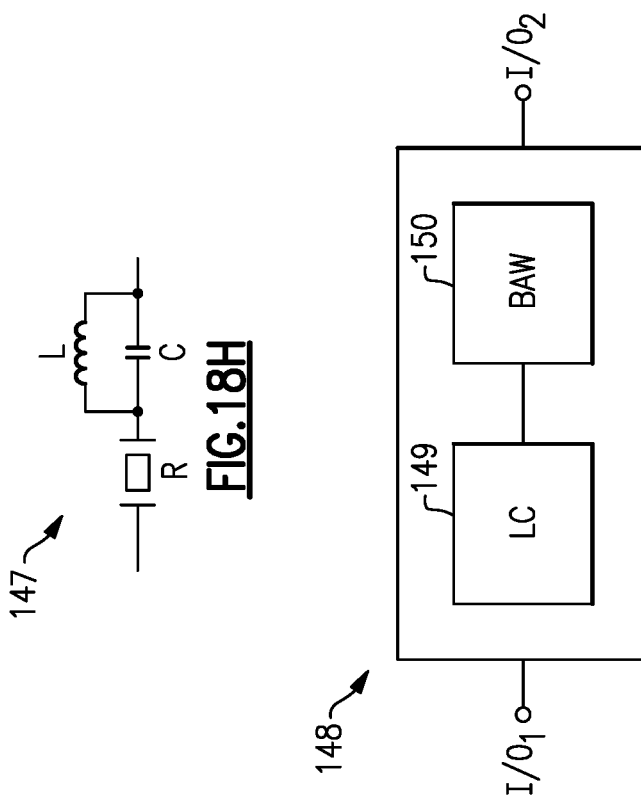
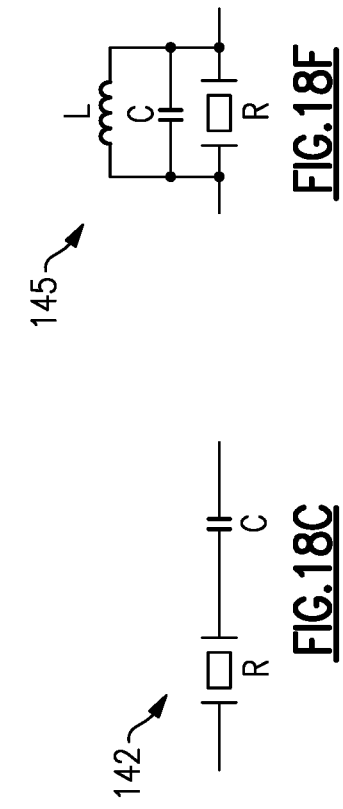
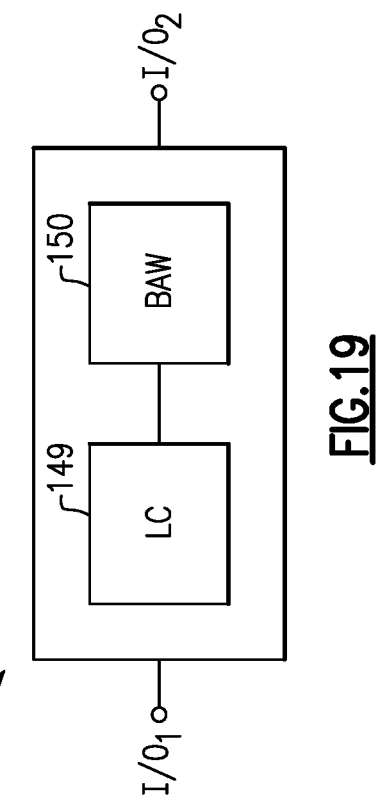
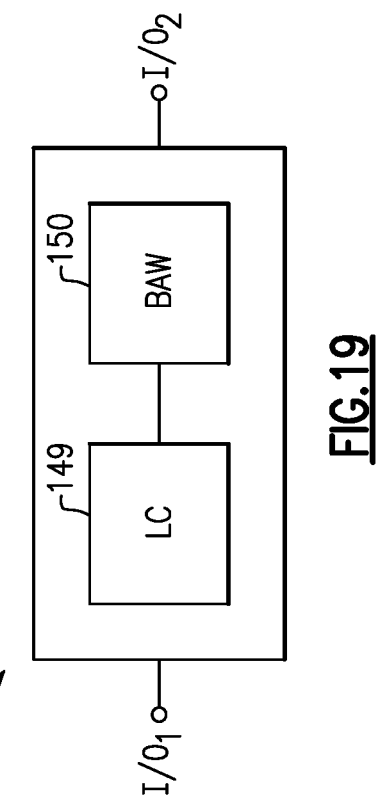
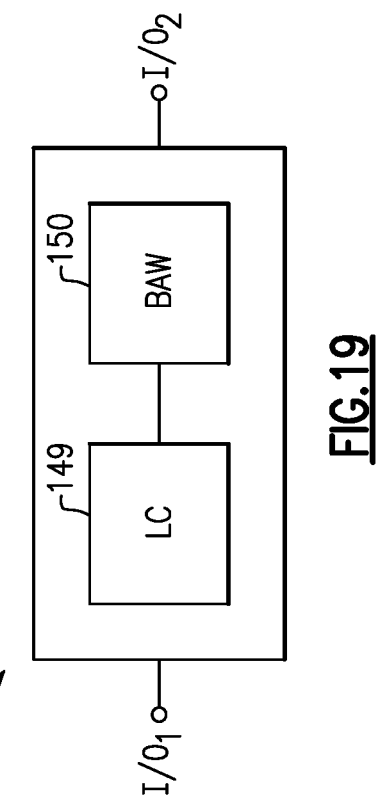

ACOUSTIC WAVE FILTER WITH OVERTONE MODE RESONATORS

CROSS REFERENCE TO PRIORITY APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/168,501, filed Mar. 31, 2021 and titled "ACOUSTIC WAVE FILER WITH OVERTONE MODE RESONATORS," the disclosure of which is hereby incorporated by reference in its entirety and for all purposes. This application also claims the benefit of priority of U.S. Provisional Application No. 63/168,568, filed Mar. 31, 2021 and titled "ACOUSTIC WAVE FILER WITH OVERTONE MODE RESONATOR AND FUNDAMENTAL MODE RESONATOR," the disclosure of which is hereby incorporated by reference in its entirety and for all purposes.

BACKGROUND

Technical Field

Embodiments of this disclosure relate to acoustic wave devices and, more specifically, to filters with bulk acoustic wave devices.

Description of Related Technology

An acoustic wave filter can include a plurality of resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and BAW solidly mounted resonators (SMRs). In BAW resonators, acoustic waves propagate in a bulk of a piezoelectric layer.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. Achieving a relatively high resonant frequency for an acoustic wave resonator is desirable for certain applications. At the same time, handling relatively high power signals with such acoustic wave resonators can be desirable.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter with overtone mode bulk acoustic wave resonators. The acoustic wave filter includes a first bulk acoustic wave resonator including a first plurality of stacked piezoelectric layers positioned between a pair of first electrodes. The first bulk acoustic wave resonator is configured to excite an overtone mode as a main mode of the first bulk acoustic wave resonator. The acoustic wave filter also includes second bulk acoustic wave resonator including a second plurality of stacked piezoelectric layers positioned between a pair of second electrodes. The second bulk acoustic wave resonator is configured to excite the overtone mode as a main mode of the second bulk acoustic wave resonator. The second bulk acoustic wave resonator is coupled to the first bulk acoustic wave resonator. The acoustic wave filter is configured to filter a radio frequency signal.

All bulk acoustic wave resonators of the acoustic wave filter can be configured to excite the overtone mode as a respective main mode. The first and second bulk acoustic wave resonators can be on a common substrate. The first and second bulk acoustic wave resonators can be enclosed within a packaging structure. The packaging structure can include a cap wafer positioned over the first and second bulk acoustic wave resonators.

The acoustic wave filter can include a third bulk acoustic wave resonator. The first and second bulk acoustic wave resonators can be on a side of a first substrate, and the third bulk acoustic wave resonator being on a side of a second substrate where the side of the first substrate faces the side of the second substrate. The first, second, and third bulk acoustic wave resonators can be co-packaged with each other. The third bulk acoustic wave resonator can include a single piezoelectric layer. The third bulk acoustic wave resonator can have a fundamental mode as a main mode of the third bulk acoustic wave resonator. The third acoustic wave resonator can be coupled in series with the first bulk acoustic wave resonator. The first bulk acoustic wave resonator can be a first series resonator from a first input/output port of the acoustic wave filter. The third bulk acoustic wave resonator can be electrically connected to the first bulk acoustic wave resonator by way of a conductive pillar. The acoustic wave filter can includes a plurality of additional fundamental mode bulk acoustic wave resonators.

The acoustic wave filter can include an integrated passive device co-packaged with the first and second bulk acoustic wave resonators. The integrated passive device can be an inductor that is electrically connected to the first bulk acoustic wave resonator. The integrated passive device can be a capacitor that is electrically connected to the first bulk acoustic wave resonator. The integrated passive device can be electrically connected in series with the first bulk acoustic wave resonator. The integrated passive device can be electrically connected in parallel with the first bulk acoustic wave resonator.

The first plurality of stacked piezoelectric layers can include first piezoelectric layer having a first c-axis and a second piezoelectric layer having a second c-axis, where the first c-axis and the second c-axis are oriented in substantially opposite directions.

The first plurality of stacked piezoelectric layers have a combined thickness in a range from 0.2 micrometer to 5 micrometers.

The first bulk acoustic wave resonator can include a raised frame structure. The first bulk acoustic wave resonator can include a recessed frame structure.

A resonant frequency of the overtone mode of the first bulk acoustic wave resonator can be in a range from 5 gigahertz to 12 gigahertz. A resonant frequency of the overtone mode of the first bulk acoustic wave resonator can be in a range from 5 gigahertz to 20 gigahertz.

The acoustic wave filter can be a band pass filter having a passband corresponding to a fifth generation New Radio operating band. The acoustic wave filter can be a transmit filter.

The overtone mode can be a second overtone mode. The overtone mode can be a third overtone mode.

The first bulk acoustic wave resonator can include an air cavity over a substrate.

Another aspect of this disclosure is an acoustic wave filter with bulk acoustic wave resonators. The acoustic wave filter includes a first bulk acoustic wave resonator configured to excite an overtone mode as a main mode of the first bulk acoustic wave resonator. The bulk acoustic wave filter also includes a second bulk acoustic wave resonator having a fundamental mode as a main mode of the second bulk acoustic wave resonator. The second bulk acoustic wave resonator is coupled to the first bulk acoustic wave resonator. The acoustic wave filter is configured to filter a radio frequency signal.

The first bulk acoustic wave resonator can be a first series resonator from an input/output port of the acoustic wave filter. The second bulk acoustic wave resonator can be coupled to the input/output port of the acoustic wave filter by way of the first bulk acoustic wave resonator. The acoustic wave filter can include a third bulk acoustic wave resonator configured to excite the overtone mode as a main mode of the third bulk acoustic wave resonator. The third bulk acoustic wave resonator can be a first series resonator from a second input/output port of the acoustic wave filter. The acoustic wave filter can include a fourth bulk acoustic wave resonator configured to excite the overtone mode as a main mode of the fourth bulk acoustic wave resonator. The fourth bulk acoustic wave resonator can be a first shunt resonator from the second input/output port of the acoustic wave filter. The acoustic wave filter can include a plurality of series bulk acoustic wave resonators coupled in series between the first bulk acoustic wave resonator and the third bulk acoustic wave resonator, where each of the plurality of series bulk acoustic wave resonators have the fundamental mode as a respective main mode, and the plurality of series bulk acoustic wave resonators include the second bulk acoustic wave resonator.

The first bulk acoustic wave resonator can include a first piezoelectric and electrode stack on a side of a first substrate. The second bulk acoustic wave resonator can include a second piezoelectric and electrode stack on a side of a second substrate. The side of the first substrate can face the side of the second substrate. The first and second bulk acoustic wave resonators can be co-packaged with each other. The first bulk acoustic wave resonator and the second bulk acoustic wave resonator can be electrically connected to each other within a package structure.

The acoustic wave filter can include an integrated passive device co-packaged with the first and second bulk acoustic wave resonators. The integrated passive device can be a capacitor. The integrated passive device can be an inductor. The integrated passive device can be electrically connected to the first bulk acoustic wave resonator. The integrated passive device can be electrically connected in series with the first bulk acoustic wave resonator. The integrated passive device can be electrically connected in parallel with the first bulk acoustic wave resonator. The integrated passive device can be electrically connected in series with the second bulk acoustic wave resonator. The integrated passive device can be electrically connected in parallel with the second bulk acoustic wave resonator.

The acoustic wave filter can include fewer bulk acoustic wave resonators with the overtone mode as a respective main mode than bulk acoustic wave resonators with the fundamental mode as a respective main mode.

The first bulk acoustic wave resonator can include a plurality of stacked piezoelectric layers. The second bulk acoustic wave resonator can include a single piezoelectric layer. The plurality of stacked piezoelectric layers can together be at least 1.5 times as thick as the single piezoelectric layer. The plurality of stacked piezoelectric layers can together be at least twice times as thick as the single piezoelectric layer. The plurality of stacked piezoelectric layers can have a combined thickness in a range from 0.2 micrometer to 5 micrometers. The plurality of piezoelectric layers can include first piezoelectric layer having a first c-axis and a second piezoelectric layer having a second c-axis, where the first c-axis is oriented in a substantially opposite direction from the second c-axis.

A resonant frequency of the overtone mode of the first bulk acoustic wave resonator can be in a range from 5 gigahertz to 12 gigahertz. A resonant frequency of the overtone mode of the first bulk acoustic wave resonator can be in a range from 5 gigahertz to 20 gigahertz. The acoustic wave filter can be a band pass filter having a passband corresponding to a fifth generation New Radio operating band.

The overtone mode can be a second overtone mode. The overtone mode can be a third overtone mode.

Another aspect of this disclosure is an acoustic wave filter with bulk acoustic wave resonators. The acoustic wave filter includes a bulk acoustic wave resonator of a first type and a bulk acoustic wave resonator of a second type. The bulk acoustic wave resonator of the first type is coupled to the bulk acoustic wave resonator of the second type. The bulk acoustic wave resonator of the first type has better power handling than the bulk acoustic wave resonator of the second type. The acoustic wave filter configured to filter a radio frequency signal.

Another aspect of this disclosure is a radio frequency module that includes an acoustic wave filter in accordance with any suitable principles and advantages disclosed herein and a radio frequency circuit element coupled to the acoustic wave filter. The acoustic wave filter and the radio frequency circuit element are enclosed within a common package.

The radio frequency circuit element can be a radio frequency amplifier arranged to amplify a radio frequency signal. The radio frequency amplifier can be a low noise amplifier. The radio frequency amplifier can be a power amplifier. The radio frequency module can further include a switch configured to selectively couple a terminal of the acoustic wave filter to an antenna port of the radio frequency module. The radio frequency circuit element can be a switch configured to selectively couple the acoustic wave filter to an antenna port of the radio frequency module.

Another aspect of this disclosure is a wireless communication device that includes an acoustic wave filter in accordance with any suitable principles and advantages disclosed herein, an antenna operatively coupled to the acoustic wave filter, a radio frequency amplifier operatively coupled to the acoustic wave filter and configured to amplify a radio frequency signal, and a transceiver in communication with the radio frequency amplifier.

Another aspect of this disclosure is a method of filtering a radio frequency signal that includes: receiving a radio frequency signal at a port of an acoustic wave filter in accordance with any suitable principles and advantages disclosed herein; and filtering the radio frequency signal with the acoustic wave filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/651,632, titled "ACOUSTIC WAVE FILER WITH OVERTONE MODE RESONATOR AND FUNDAMENTAL MODE RESONATOR," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 3A is a cross sectional schematic diagram of a zoomed in portion of the BAW device of FIG. 1. FIG. 3B is a graph of admittance versus frequency for the BAW device of FIG. 3A.

FIG. 9A is a cross sectional schematic diagram of a portion of a BAW device illustrating a stress distribution for a fundamental mode. FIG. 9B is a cross sectional schematic diagram of a portion of a BAW device illustrating a stress distribution for a second overtone mode. FIG. 9C is a cross sectional schematic diagram of a portion of a BAW device illustrating a stress distribution for a third overtone mode.

FIGS. 18A to 18H are schematic diagrams of a BAW resonator and at least one passive component according to embodiments.

FIG. 19 is a schematic block diagram of a filter with a BAW component and an inductor-capacitor component according to an embodiment.

DETAILED DESCRIPTION OF CERTAIN EMBODIMENTS

Figure 1:
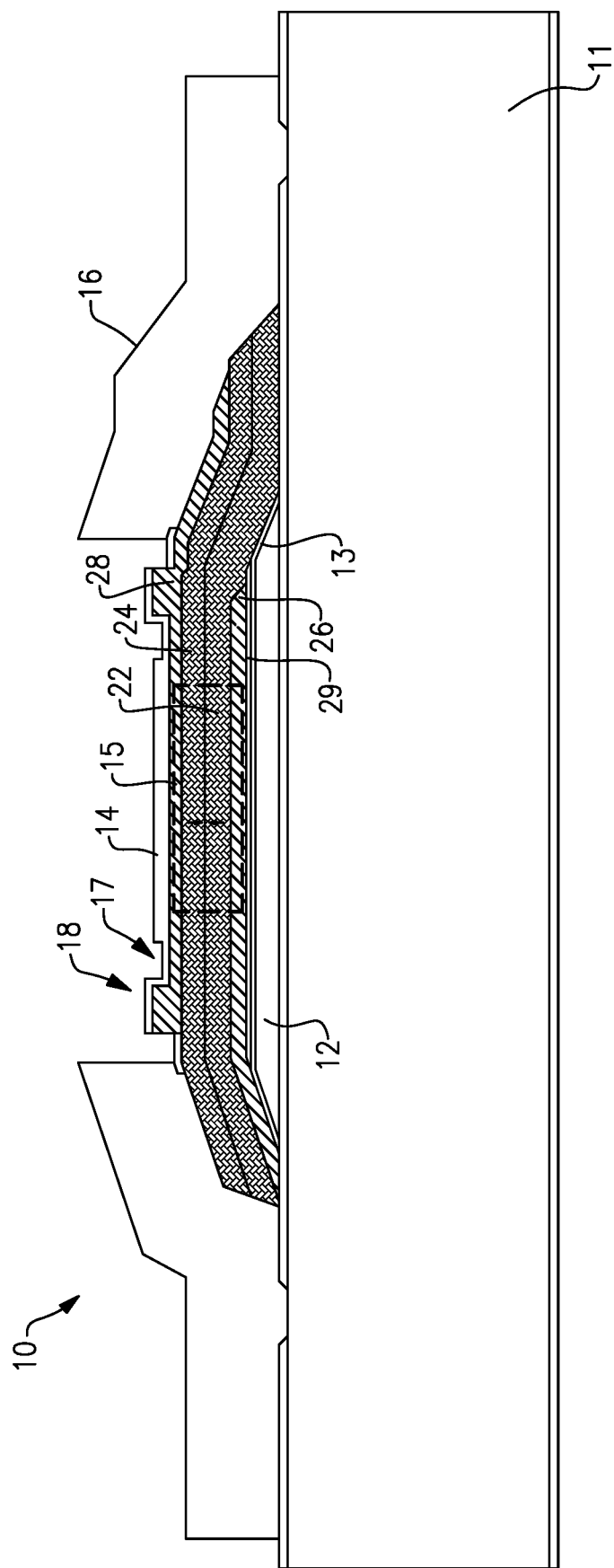
FIG. 1 is a schematic cross-sectional diagram of a bulk acoustic wave (BAW) device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As demands increase for filtering radio frequency signals with higher frequencies, acoustic wave resonators with higher resonant frequencies are desired. Bulk acoustic wave (BAW) resonators often use a fundamental mode as a main mode. In such BAW resonators, higher resonant frequencies have been achieved by reducing layer thicknesses. BAW resonators with thinner piezoelectric layer have generally provided higher resonant frequencies. Thinner electrodes can also contribute to a higher resonant frequency for a BAW resonator. Certain performance parameters, such as power handling, can be degraded in BAW resonators with thinner layers.

Aspects of this disclosure relate to a BAW device with a plurality of stacked piezoelectric layers that excite an overtone mode. The stacked piezoelectric layers are positioned between a lower electrode and an upper electrode of the BAW device. The stacked piezoelectric layers can have different c-axis orientations so as to excite an overtone mode as a main mode for the BAW device. For example, two adjacent piezoelectric layers can have c-axes oriented in opposite directions. The stacked piezoelectric layers can generate one or more additional resonances compared to a BAW resonator with a single piezoelectric layer. The overtone mode can be about 2 times or about 3 times the frequency of the fundamental mode of the BAW device in some instances. For example, if a fundamental frequency for a BAW device is 2 gigahertz (GHz), the overtone made can have a resonant frequency at about 4 GHz or about 6 GHz. In certain applications, the overtone mode can be over 3 times a fundamental frequency of the BAW device.

BAW devices with stacked piezoelectric layers disclosed herein can excite overtone modes with relatively high resonant frequencies. Such BAW devices can excite an overtone mode with a resonant frequency in a range from 5 GHz to 20 GHz, such as in a range from 5 GHz to 12 GHz. Some such BAW devices can have a resonant frequency in a range from 5 GHz to 7.5 GHz. These BAW devices can be used in band pass filters having a passband over 5 GHz and within fifth generation (5G) New Radio (NR) Frequency Range 1 (FR1). Some BAW devices with stacked piezoelectric layers disclosed herein can have a resonant frequency in a range from 7 GHz to 10 GHz.

BAW devices with a plurality of stacked piezoelectric layers with a combined thickness in a range from 0.2 micrometer (um) to 5 um can excite on overtone mode with a resonant frequency in a range from 5 GHz to 12 GHz. In some instances, such stacked piezoelectric layers can have a combined thickness in a range from 2 um to 5 um. The stacked piezoelectric layers can have c-axes implemented in accordance with any suitable principles and advantages disclosed herein. Such devices have a thicker piezoelectric and electrode layer stack than a similar BAW resonator with a single piezoelectric layer and the same resonant frequency for a fundamental mode. With the thicker stack, higher power handling can be achieved. BAW devices with stacked piezoelectric layers that each include aluminum nitride and with a combined thickness in a range from 0.2 um to 5 um can excite on overtone mode with a resonant frequency in a range from 5 GHz to 12 GHz. Any other suitable piezoelectric material can alternatively or additionally be used.

While embodiments disclosed herein may relate to BAW devices that excite a second overtone mode or a third overtone mode, any suitable principles and advantages disclosed herein can be applied to a BAW device with more stacked piezoelectric layers that is arranged to excite a fourth overtone mode, a fifth overtone mode, or higher overtone mode. Such BAW devices can excite an overtone mode with a resonant frequency in a range from 5 GHz to 20 GHz.

Aspects of this disclosure relate to filters with overtone mode BAW resonators. Such filters can include overtone mode BAW resonators in accordance with any suitable principles and advantages disclosed herein. The BAW overtone mode resonators can have relatively thick piezoelectric and electrode stacks relative to single piezoelectric layer fundamental mode BAW resonators having a same resonant frequency. This can provide a more rugged structure for the overtone mode BAW resonators, particularly at higher resonant frequencies. A combined thickness of multiple stacked piezoelectric layers of an overtone mode BAW resonators can be at least about two times a thickness of a single piezoelectric layer fundamental mode BAW resonator with a same resonant frequency. The capacitance of such an overtone mode BAW resonator can be about half of such a fundamental mode BAW resonator. Accordingly, the overtone mode BAW resonator can have an increased physical size and enhanced power handling. Acoustic wave filters can include all overtone mode BAW resonators in certain applications. Acoustic wave filters can include one or more overtone mode BAW resonators and one or more fundamental mode BAW resonators in some other applications. The acoustic wave filters disclosed herein can be implemented in higher power applications.

Aspects of this disclosure relate to acoustic wave filters that include an overtone mode BAW resonator and a fundamental mode BAW resonator. Such acoustic wave filters can include one or more overtone mode BAW resonators where greater power handling is desired in the acoustic wave filter and include one or more fundamental mode BAW resonators where such resonators have less of an impact on power handling. As an example, a first series acoustic resonator from an antenna side input/output port of the acoustic wave filter can be an overtone mode BAW resonator. The overtone mode BAW resonator can be co-packaged with the fundamental mode BAW resonator. For example, the overtone mode BAW resonator and the fundamental mode BAW resonator can be on sides of respective substrates that face each other. The overtone mode BAW resonator and the fundamental mode BAW resonator can be electrically connected to each other within a packaging structure. In certain applications, one or more integrated passive devices can be co-packaged with the overtone BAW resonator and the fundamental mode BAW resonator.

BAW devices with stacked piezoelectric layers between electrodes disclosed herein can achieve a relatively high resonant frequency and also receive a relatively high electromechanical coupling coefficient $k^2$. BAW devices disclosed herein can suppress non-linearity excitation responses, such as a second harmonic response. Suppressing non-linearities can contribute to meeting stringent 5G NR system level linearity specifications.

With stacked piezoelectric layers between electrodes exciting an overtone mode, a BAW device can achieve a relatively high resonant frequency with a thicker piezoelectric stack than a BAW device with a single piezoelectric layer with the same resonant frequency. The BAW device with stacked piezoelectric layers can have better power handling. This can be advantageous in transmit filters. Moreover, better power handling can be advantageous for certain 5G NR applications with relatively high power. In 5G NR applications, BAW devices disclosed herein can be used for filtering higher frequency ranges than used in certain previous applications for BAW devices.

Any suitable principles and advantages disclosed herein can be implemented in a film bulk acoustic wave resonator (FBAR), a BAW solidly mounted resonator (SMR), or a Lamb wave resonator. Any suitable principles and advantages disclosed herein can be implemented in an acoustic wave device that generates an acoustic wave in a piezoelectric layer.

Example BAW devices with a plurality of stacked piezoelectric layers positioned between an upper electrode and a lower electrode will now be discussed. Any suitable principles and advantages of these BAW devices can be implemented together with each other.

FIG. 1 is a cross sectional diagram of a BAW device 10 according to an embodiment. As illustrated, the BAW device 10 includes a support substrate 11, an air cavity 12, a first passivation layer 13, a second passivation layer 14, an electrode and piezoelectric stack 15, and an interconnect layer 16. The BAW device 10 also includes a recessed frame structure 17 and a raised frame structure 18. The electrode and piezoelectric stack 15 includes a plurality of piezoelectric layers 22 and 24, a first electrode 26, and a second electrode 28. A zoomed in view of the electrode and piezoelectric stack 15 of the BAW device 10 is shown in FIG. 3A. The zoomed in view of the electrode and piezoelectric stack 15 is in a main acoustically active region of the BAW device 10. More details regarding the piezoelectric layers 22 and 24, the first electrode 26, and the second electrode 28 will be discussed with reference to FIG. 3A.

An active region or active domain of the BAW device 10 can be defined by a portion of the stacked the piezoelectric layers that is in contact with both the first electrode 26 and the second electrode 28 and overlaps an acoustic reflector, such as the air cavity 12 or a solid acoustic mirror. The active region corresponds to where voltage is applied on opposing sides of the stack of piezoelectric layers over the acoustic reflector. The active region can be the acoustically active region of the BAW device 10. The BAW device 10 also includes a recessed frame region with the recessed frame structure 17 in the active region and a raised frame region with the raised frame structure 18 in the active region. The main acoustically active region can provide a main mode of the BAW device 10. The main acoustically active region can be the central part of the active region that is free from the recessed frame structure 17 and the raised frame structure 18.

While the BAW device 10 includes the recessed frame structure 17 and the raised frame structure 18, other frame structures can alternatively or additionally be implemented. For example, a raised frame structure with multiple layers including a layer between an electrode of a BAW device and a piezoelectric layer can be implemented. As another example, a floating raised frame structure can be implemented. As one more example, a raised frame structure can be implemented without a recessed frame structure.

The air cavity 12 is an example of an acoustic reflector. As illustrated, the air cavity 12 is located above the support substrate 11. The air cavity 12 is positioned between the support substrate 11 and the first electrode 26. In some applications, an air cavity can be etched into a support substrate. The support substrate 11 can be a silicon substrate. The support substrate 11 can be any other suitable support substrate. The electrical interconnect layer 16 can electrically connect electrodes of the BAW device 10 to one or more other BAW devices, one or more integrated passive devices, one or more other circuit elements, one or more signal ports, the like, or any suitable combination thereof.

The first passivation layer 13 is positioned between an acoustic reflector and the first electrode 26. The first passivation layer 13 can be referred to as a lower passivation layer. The first passivation layer 13 can be a silicon dioxide layer or any other suitable passivation layer, such as aluminum oxide, silicon carbide, aluminum nitride, silicon nitride, silicon oxynitride, or the like. In certain applications, an adhesion layer 29 can be positioned between the first passivation layer 13 and the first electrode 26 to increase adhesion between these layers. The adhesion layer 29 can be a titanium layer, for example.

The second passivation layer 14 can be referred to as an upper passivation layer. The second passivation layer 14 can be a silicon dioxide layer or any other suitable passivation layer, such as aluminum oxide, silicon carbide, aluminum nitride, silicon nitride, silicon oxynitride, or the like. The second passivation layer 14 can be the same material as the first passivation layer 13 in certain instances. The second passivation layer 14 can have different thicknesses in different regions of the BAW device 10. Part of the second passivation layer 14 can form at least part of the recessed frame structure 17 and/or the raised frame structure 18.

Figure 2A:
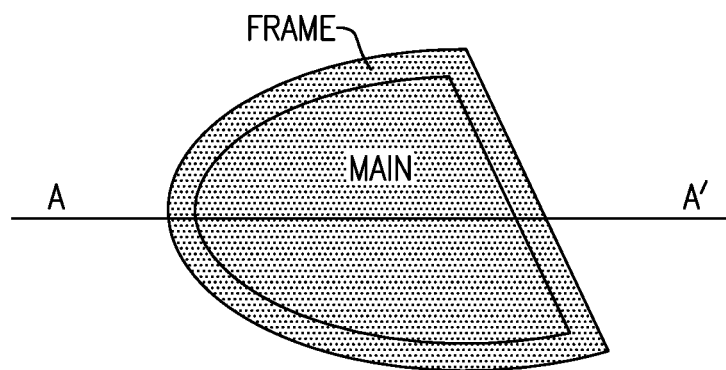
FIG. 2A is an example plan view of the BAW device of FIG. 1.
Figure 2B:
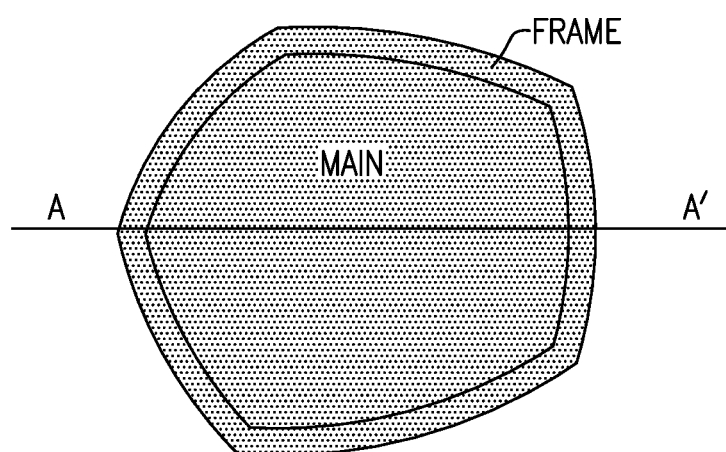
FIG. 2B is another example plan view of the BAW device of FIG. 1.

FIGS. 2A and 2B are example plan views of the BAW device 10 of FIG. 1. Any other BAW devices disclosed herein can be implemented with the same or a similar shape to the BAW device 10 in plan view. The cross-sectional view of FIG. 1 is can be along the line from A to A' in FIG. 2A or FIG. 2B. In FIGS. 2A and 2B, the frame region FRAME and the main acoustically active region MAIN are shown. As illustrated, the main acoustically active region MAIN can correspond be the majority of the area of the BAW device 10. The frame region FRAME includes the recessed frame structure 17 and the raised frame structure 18 of the BAW device 10 of FIG. 1. FIG. 2A illustrates the BAW device 10 with a semi-elliptical shape in plan view. FIG. 2B illustrates the BAW device 10 with a pentagon shape with curved sides in plan view. A BAW device in accordance with any suitable principles and advantages disclosed herein can have any other suitable shape in plan view, such as a quadrilateral shape, a quadrilateral shape with curved sides, a semicircular shape, a circular shape, or ellipsoid shape.

FIG. 3A is a cross sectional schematic diagram of a zoomed in portion of the electrode and piezoelectric stack 15 of the BAW device 10 of FIG. 1. FIG. 3A illustrates the electrodes and piezoelectric layers in a main acoustically active region of the BAW device 10. In the electrode and piezoelectric stack 15, the first piezoelectric layer 22 and the second piezoelectric layer 24 are stacked with each other and sandwiched between the first electrode 26 and the second electrode 28. The second piezoelectric layer 24 is positioned between the first piezoelectric layer 22 and the second electrode 28. The first piezoelectric layer 22 is positioned between the first electrode 25 and the second piezoelectric layer 24. The first piezoelectric layer 22 and the second piezoelectric layer 24 can be in physical contact with each other in a main acoustically active region of the BAW device 10 as illustrated. In FIG. 3A, planar surfaces of first piezoelectric layer 22 and the second piezoelectric layer 24 in physical contact with each other are parallel to a planar surface of the first electrode 26.

As shown in FIG. 3A, the first piezoelectric layer 22 and the second piezoelectric layer 24 have c-axes oriented in different directions. The c-axis of the first piezoelectric layer 22 is oriented in an opposite direction than the c-axis of the second piezoelectric layer 24. To manufacture c-axes with opposite direction growth, a seed layer can be (1) included on an interface between the first piezoelectric layer 22 and first electrode 26 and/or (2) included on an interface between the first piezoelectric layer 22 and the second piezoelectric layer 24. The c-axis of the first piezoelectric layer 22 is rotated 180° relative to the c-axis of the second piezoelectric layer 24 in FIG. 3A. The c-axis of the first piezoelectric layer 22 can be substantially opposite relative to the c-axis of the second piezoelectric layer 24. Such c-axes oriented in substantially opposite directions can be rotated by an angle in a range from 170° to 190° relative to each other.

As illustrated in FIG. 3A, the c-axis of the first piezoelectric layer 22 and the c-axis of the second piezoelectric layer 24 are both oriented perpendicular to a planar surface of the first electrode 26. Similarly, the c-axis of the first piezoelectric layer 22 and the c-axis of the second piezoelectric layer 24 are both oriented perpendicular to a planar surface of the second electrode 28 in FIG. 3A. The c-axis of the first piezoelectric layer 22 and/or the c-axis of the second piezoelectric layer can be substantially perpendicular to a planar surface of the first electrode 26 and/or a planar surface of the second electrode 28. Such substantially perpendicular c-axes can be oriented at an angle in a range from 85° to 95° relative to a planar surface of an electrode. While a piezoelectric layer with a c-axis substantially perpendicular to a planar electrode surface is preferred in certain applications, any other suitable c-axis orientation can be implemented for a particular application.

The arrangement of the stacked piezoelectric layers 22 and 24 can excite an overtone mode as a main mode for the BAW resonator 10. The overtone mode is a second overtone mode for the BAW device 10. The overtone mode has a resonant frequency that can be about 2 times a resonant frequency of a fundamental mode of the BAW device 10. The resonant frequency for the overtone mode may not be exactly 2 times a resonant frequency of the fundamental mode due to contributions of the electrodes of the BAW device 10 to resonant frequency.

The first piezoelectric layer 22 and the second piezoelectric layer 24 can both include a same piezoelectric material. The first piezoelectric layer 22 can include aluminum nitride. The second piezoelectric layer 24 can include aluminum nitride. The first piezoelectric layer 22 and/or the second piezoelectric layer 24 can include any suitable piezoelectric material. For example, the first piezoelectric layer 22 and/or the second piezoelectric layer 24 can include zinc oxide.

The first piezoelectric layer 22 can be doped with any suitable dopant, such as scandium (Sc), chromium (Cr), magnesium (Mg), or the like. For example, the first piezoelectric layer 22 can be doped with scandium. Doping the first piezoelectric layer 22 can adjust resonant frequency. Doping the first piezoelectric layer 22 can increase the coupling coefficient $k^2$ of the BAW device 10. Doping to increase the coupling coefficient $k^2$ can be advantageous at higher frequencies where the coupling coefficient $k^2$ can be degraded. The second piezoelectric layer 24 can be doped with any suitable dopant. The second piezoelectric layer 24 can be doped with a same dopant as the first piezoelectric layer 24 in certain applications. In certain applications, the first piezoelectric layer 22 and the second piezoelectric layer 24 can be doped with different doping concentrations.

In certain applications, a combination of c-axis orientation and doping concentration can be adjusted in the second piezoelectric layer relative 24 to the first piezoelectric layer 22. The orientation of the c-axis can impact resonant frequency of a BAW device. Two or more properties of the second piezoelectric layer 24 can be adjusted relative to the first piezoelectric layer 22.

The first piezoelectric layer 22 can have approximately the same thickness as the second piezoelectric layer 24 in certain applications. The first piezoelectric layer 22 and the second piezoelectric layer 24 can have any suitable relative sizes for a particular application. For instance, the first piezoelectric layer 22 and the second piezoelectric layer 24 can have an approximately 60/40 thickness ratio in certain applications. The ratio of the first piezoelectric layer 22 and the second piezoelectric layer 24 can be selected based on parasitics associated with the BAW device 10 that includes the piezoelectric layers 22 and 24. For example, relative sizes of the piezoelectric layers 22 and 24 can be selected to provide stronger suppression of a non-linearity in the presence of parasitics that impact the piezoelectric layers 22 and 24.

The first electrode 26 can be referred to as a lower electrode. The first electrode 26 can have a relatively high acoustic impedance. The first electrode 26 can include molybdenum (Mo), tungsten (W), ruthenium (Ru), chromium (Cr), iridium (Ir), platinum (Pt), Ir/Pt, or any suitable alloy and/or combination thereof. Similarly, the second electrode 28 can have a relatively high acoustic impedance. The second electrode 28 can include Mo, W, Ru, Cr, Ir, Pt, Ir/Pt, or any suitable alloy and/or combination thereof. The second electrode 28 can be formed of the same material as the first electrode 26 in certain instances. The second electrode 28 can be referred to as an upper electrode. The thickness of the first electrode 26 can be approximately the same as the thickness of the second electrode 28 in the BAW material stack 15. The first electrode 26 and the second electrode 28 can be the only electrodes of the BAW device 10.

FIG. 3B is a graph of admittance versus frequency for an embodiment of the BAW device of FIGS. 1 and 3A. The graph corresponds to the BAW device 10 where the first electrode 26 is a Mo electrode with a thickness of 0.3 um, the second electrode 28 is a Mo electrode with a thickness of 0.3 um, and each of the piezoelectric layers 22 and 25 are aluminum nitride layers with a thickness of 1 um. As shown in FIG. 3B, the BAW device of FIGS. 1 and 3A can have a resonant frequency of over 6 GHz. This resonant frequency is associated with a second overtone mode exited by the BAW material stack 15. The resonant frequency for the overtone mode is where the admittance is at a maximum in FIG. 3B. The anti-resonant frequency for the overtone mode is where the admittance is at a minimum in FIG. 3B.

Figure 4B:
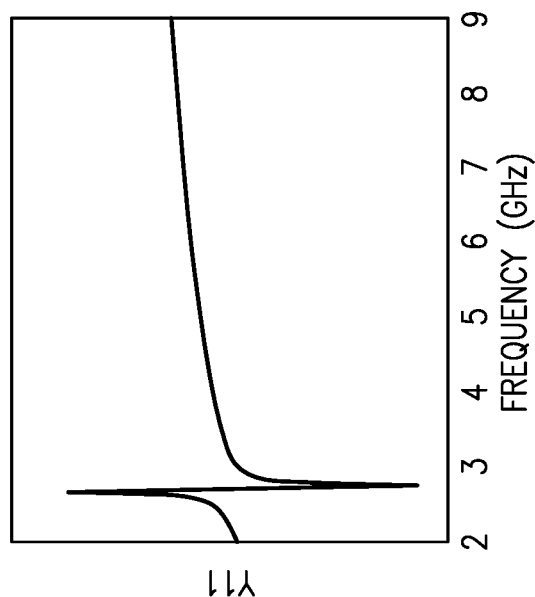
FIG. 4B is a graph of admittance versus frequency for the BAW device of FIG. 4A.
Figure 4A:
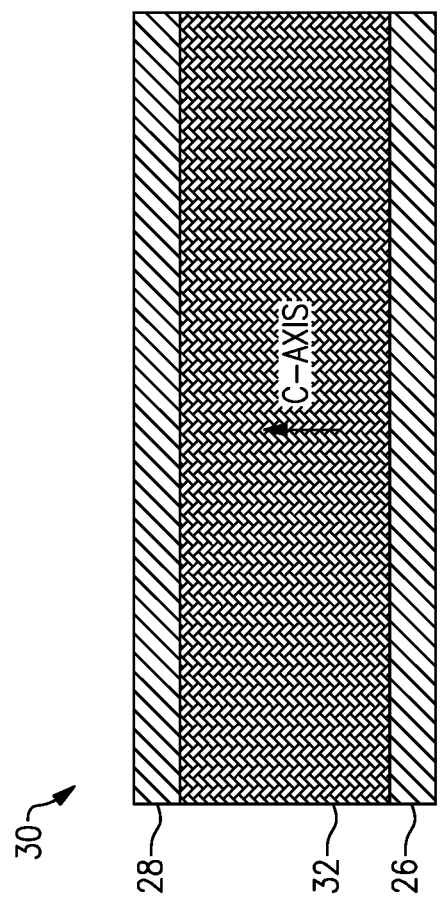
FIG. 4A is a cross sectional schematic diagram of a portion of a BAW device where a fundamental mode is a main mode.

FIG. 4A is a cross sectional schematic diagram of an electrode and piezoelectric stack 30 of a BAW device where a fundamental mode is a main mode. The electrode and piezoelectric stack 30 includes a single piezoelectric layer 32 positioned between a first electrode 26 and a second electrode 28. The piezoelectric layer 32 can have a similar thickness to the first piezoelectric layer 22 of FIG. 3A.

FIG. 4B is a graph of admittance versus frequency for the BAW device corresponding to the electrode and piezoelectric stack 30 of FIG. 4A. The graph corresponds to a BAW device where the first electrode 26 is a Mo electrode with a thickness of 0.3 um, the second electrode 28 is a Mo electrode with a thickness of 0.3 um, and the piezoelectric layer 32 is an aluminum nitride layers with a thickness of 1 um. As shown in FIG. 4B, the BAW device corresponding to FIG. 4A has a resonant frequency of below 3 GHz. This resonant frequency is associated with a fundamental mode exited by the electrode and piezoelectric stack 30. The resonant frequency for the fundamental mode in FIG. 4B is less than half of the resonant frequency for the overtone mode in FIG. 3B. Generally, a resonant frequency for a second overtone mode can be about 2 times a resonant frequency of a fundamental mode.

Other embodiments of piezoelectric and electrode stacks of BAW devices with a plurality of stacked piezoelectric layers between electrodes will be discussed with reference to example cross sections shown in FIGS. 5A, 6A, 7A, and 8A. These piezoelectric and electrode stacks can be implemented in place of the piezoelectric and electrode stack 15 of FIGS. 1 and 3A. Any suitable combination of features of piezoelectric and electrode stacks of FIGS. 3A, 5A, 6A, 7A, and 8A can be combined with each other.

Figure 5B:
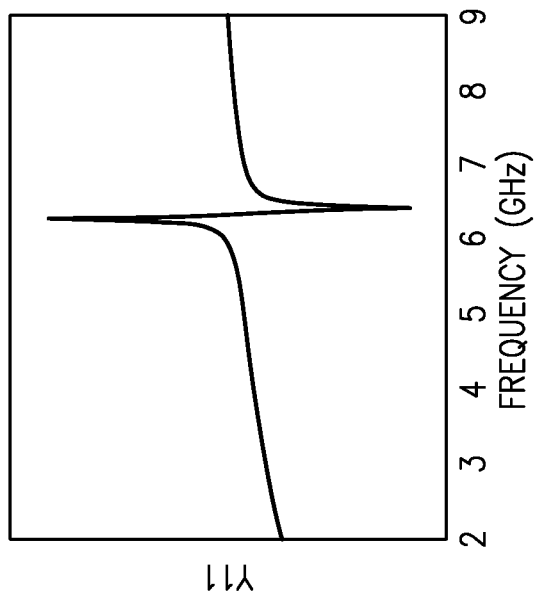
FIG. 5B is a graph of admittance versus frequency for the BAW device of FIG. 5A.
Figure 5A:
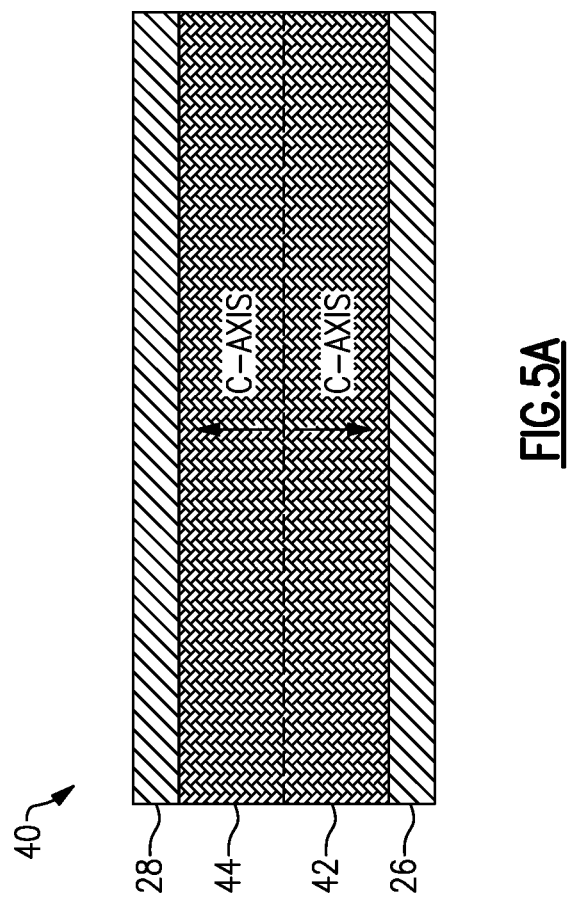
FIG. 5A is a cross sectional schematic diagram of a portion of a BAW device with a plurality of stacked piezoelectric layers positioned between electrodes according to an embodiment.

FIG. 5A is a cross sectional schematic diagram of an electrode and piezoelectric stack 40 according to an embodiment. The electrode and piezoelectric stack 40 is like the electrode and piezoelectric stack 15 of FIG. 3A, except that the piezoelectric layers 42 and 44 of FIG. 5A have opposite c-axis orientations relative to corresponding piezoelectric layers 22 and 24 of FIG. 3A.

FIG. 5B is a graph of admittance versus frequency for an embodiment of the BAW device that includes the electrode and piezoelectric stack 40 of FIG. 5A. This graph indicates that a BAW device that includes the electrode and piezoelectric stack 40 can have similar admittance over frequency compared to a similar BAW device that includes the electrode and piezoelectric stack 15.

In certain embodiments, three or more piezoelectric layers can be stacked with each other between electrodes of a BAW device to excite an overtone mode. Example electrode and piezoelectric stacks with at least three stacked piezoelectric layers are discussed with reference to FIGS. 6A to 8B.

Figure 6B:
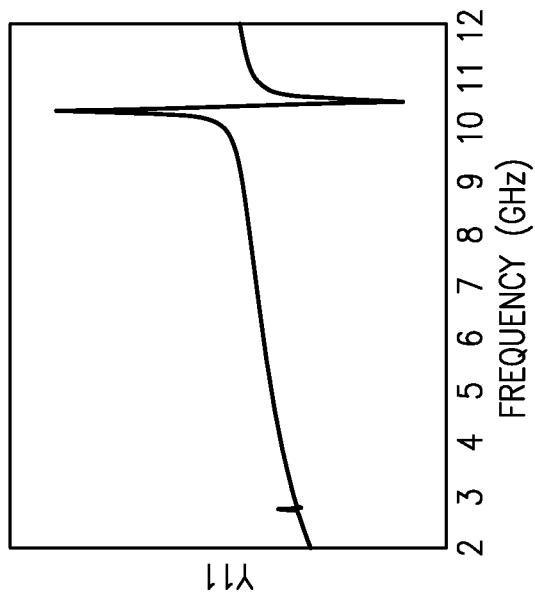
FIG. 6B is a graph of admittance versus frequency for the BAW device of FIG. 6A.
Figure 6A:
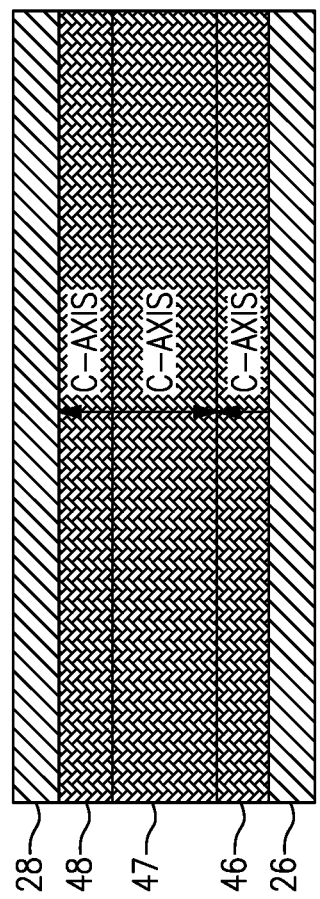
FIG. 6A is a cross sectional schematic diagram of a portion of a BAW device with a three stacked piezoelectric layers positioned between electrodes according to an embodiment.

FIG. 6A is a cross sectional schematic diagram of an electrode and piezoelectric stack 45 according to an embodiment. The electrode and piezoelectric stack 45 includes a first piezoelectric layer 46, a second piezoelectric layer 47, and a third piezoelectric layer 48. The piezoelectric layers 46, 47, and 48 are stacked with each other and positioned between the first electrode 26 and the second electrode 28. Each of the piezoelectric layers 46, 47, and 48 can be in physical contact with at least one other piezoelectric layer that has a different c-axis orientation. For example, the first piezoelectric layer 46 is illustrated as being adjacent to and in physical contact with the second piezoelectric layer 47. The first piezoelectric layer 46 and the second piezoelectric layer 47 have opposite c-axis orientations in FIG. 6A. As another example, the second piezoelectric layer 47 is illustrated as being adjacent to and in physical contact with the third piezoelectric layer 48. In some instances, a seed layer can be included between adjacent piezoelectric layers of the electrode and piezoelectric stack 45. The second piezoelectric layer 47 and the third piezoelectric layer 48 have opposite c-axis orientations in FIG. 6A. In the electrode and piezoelectric stack 45, the first piezoelectric layer 46 and the third piezoelectric layer 48 have a same c-axis orientation.

The arrangement of the stacked piezoelectric layers 46, 47, and 48 can excite an overtone mode as a main mode for a BAW resonator. The overtone mode is a third overtone mode for the BAW device corresponding to FIG. 6A. The overtone mode has a resonant frequency that can be about 3 times a resonant frequency of a fundamental mode of the BAW device. The resonant frequency for the overtone mode may not be exactly 3 times a resonant frequency of the fundamental mode due to contributions of the electrodes of the BAW device to resonant frequency.

FIG. 6B is a graph of admittance versus frequency for an embodiment of a BAW device with the electrode and piezoelectric stack 45 of FIG. 6B. As shown in FIG. 6B, the BAW device has a resonant frequency that is between 10 GHz and 11 GHz. This resonant frequency is associated with a third overtone mode exited by the electrode and piezoelectric stack 45.

Figure 7B:
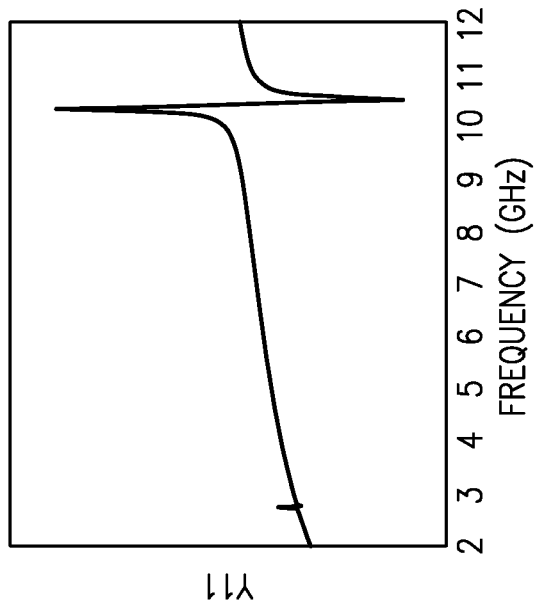
FIG. 7B is a graph of admittance versus frequency for the BAW device of FIG. 7A.
Figure 7A:
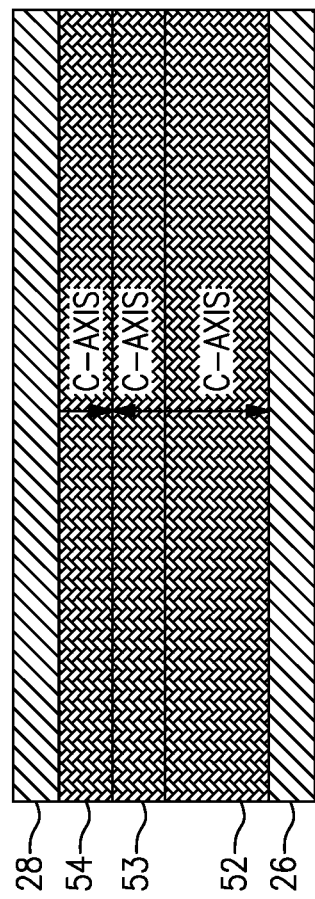
FIG. 7A is a cross sectional schematic diagram of a portion of a BAW device with a three stacked piezoelectric layers positioned between electrodes according to another embodiment.

FIG. 7A is a cross sectional schematic diagram of an electrode and piezoelectric stack 50 according to an embodiment. The electrode and piezoelectric stack 50 is like the electrode and piezoelectric stack 45 of FIG. 6A, except that the piezoelectric layers 52, 53, and 54 of FIG. 7A have different c-axis orientations relative to corresponding piezoelectric layers 46, 47, and 48 of FIG. 6A. The piezoelectric layers 52, 53, and 54 can have different respective thicknesses that piezoelectric layers 46, 47, and 48 in certain applications. A BAW device that includes electrode and piezoelectric stack 50 can excite a third overtone mode as a main mode.

FIG. 7B is a graph of admittance versus frequency for an embodiment of a BAW device that includes the electrode and piezoelectric stack 50 of FIG. 7A. This graph indicates that a BAW device that includes the electrode and piezoelectric stack 50 can have similar admittance over frequency compared to a similar BAW device that includes the electrode and piezoelectric stack 45.

Figure 8B:
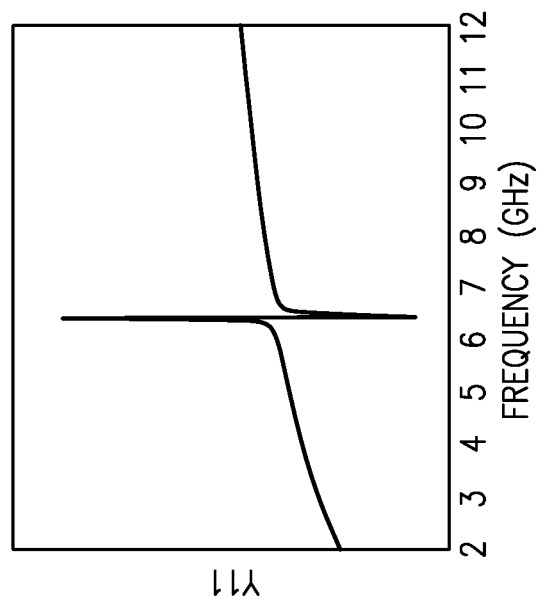
FIG. 8B is a graph of admittance versus frequency for the BAW device of FIG. 8A.
Figure 8A:
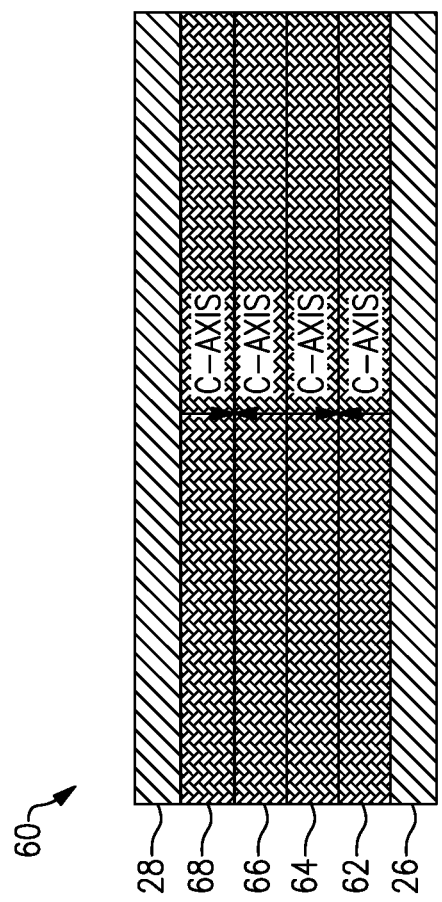
FIG. 8A is a cross sectional schematic diagram of a portion of a BAW device with a four stacked piezoelectric layers positioned between electrodes according to an embodiment.

FIG. 8A is a cross sectional schematic diagram of an electrode and piezoelectric stack 60 according to an embodiment. The electrode and piezoelectric stack 60 includes a first piezoelectric layer 62, a second piezoelectric layer 64, a third piezoelectric layer 66, and a fourth piezoelectric layer 68. The piezoelectric layers 62, 64, 66, and 68 are stacked with each other and positioned between the first electrode 26 and the second electrode 28. Each of the piezoelectric layers 62, 64, 66, and 68 can be in physical contact with at least one other piezoelectric layer that has a different c-axis orientation. As illustrated, each of the piezoelectric layers 62, 64, 66, and 68 is adjacent to at least one other piezoelectric layer with an opposite c-axis orientation.

The arrangement of the stacked piezoelectric layers 62, 64, 66, and 68 can excite an overtone mode as a main mode for a BAW resonator corresponding to FIG. 8A. The overtone mode can be a second overtone mode for the BAW device. The stacked piezoelectric layers 62, 64, 66, and 68 can excite the second overtone mode due to symmetry of the field distribution with a middle interface. This second overtone mode has a resonant frequency that can be about 2 times a resonant frequency of a fundamental mode of the BAW device.

FIG. 8B is a graph of admittance versus frequency for an embodiment of a BAW device with the electrode and piezoelectric stack 60 of FIG. 8B. As shown in FIG. 8B, the BAW device has a resonant frequency that is between 6 GHz and 7 GHz. This resonant frequency is associated with a second overtone mode exited by the electrode and piezoelectric stack 60.

Without being bound by theory, a discussion of stress distribution in BAW devices and exciting a fundamental mode, a second overtone mode, and a third overtone mode is provided. FIG. 9A is a cross sectional schematic diagram of a portion of a BAW device illustrating a stress distribution for a fundamental mode. An acoustic wave for a fundamental mode is excited by the piezoelectric layer 32 of FIG. 9A.

FIG. 9B is a cross sectional schematic diagram of a portion of a BAW device illustrating a stress distribution for a second overtone mode. Each piezoelectric layer 42 and 44 excites an acoustic wave for a fundamental mode. With opposite c-axis orientations, the piezoelectric layers 42 and 44 each excite an acoustic wave with an opposite phase. Together these acoustic waves excite a resonant frequency that can be about twice a resonant frequency of the BAW device corresponding to FIG. 9A. The BAW device corresponding to FIG. 9B has a second overtone mode as a main mode.

FIG. 9C is a cross sectional schematic diagram of a portion of a BAW device illustrating a stress distribution for a third overtone mode. The piezoelectric layers 46, 47, and 48 are each adjacent to another piezoelectric layer with an opposite c-axis orientations. The piezoelectric layers 46, 47, and 48 excite acoustic waves that together excite a third overtone mode as a main mode. The third overtone mode can have about three times a resonant frequency of a fundamental mode.

The stacked piezoelectric layers 46, 47, and 48 of FIG. 9C have one more interface where piezoelectric layers with opposite c-axis directions are in contact with each other compared to the stacked piezoelectric layers 42 and 44 of FIG. 9B. The overtone mode can be based on a number of such interfaces. A second overtone mode with one such interface can be excited as shown in FIG. 9B. A third overtone mode with two such interfaces can be excited as shown in FIG. 9C.

Figure 10:
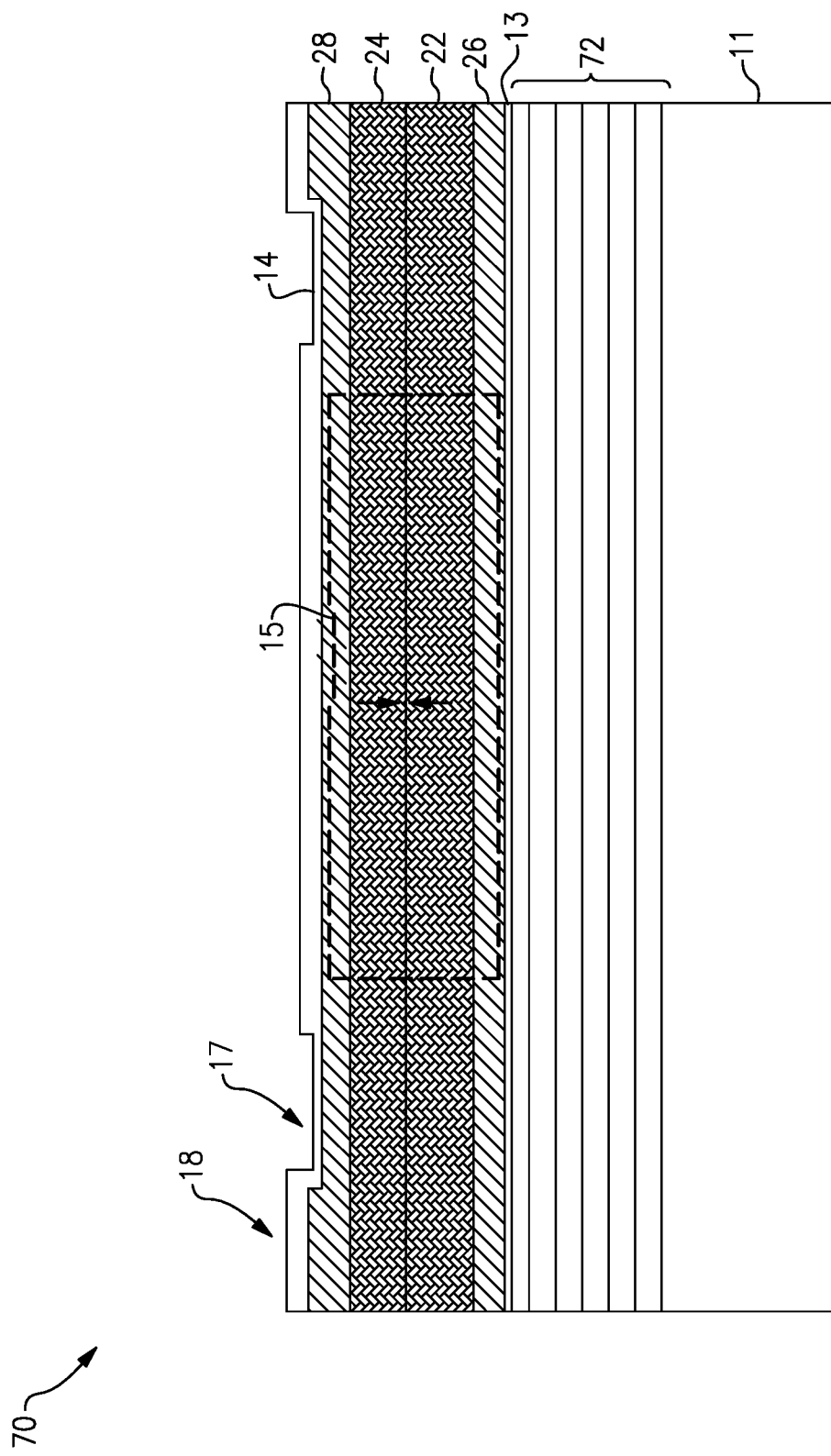
FIG. 10 is a cross sectional schematic diagram of a BAW solidly mounted resonator with a plurality of stacked piezoelectric layers between electrodes according to an embodiment.

FIG. 10 is a cross sectional schematic diagram of a BAW device 70 according to an embodiment. The BAW device 70 is like the BAW device 10 of FIG. 1 except that a solid acoustic mirror 72 is included in place of an air cavity 12. The solid acoustic mirror 72 is an acoustic Bragg reflector. The solid acoustic mirror 72 includes alternating low acoustic impedance and high acoustic impedance layers. As one example, the solid acoustic mirror 72 can include alternating silicon dioxide layers as low impedance layers and tungsten layers as high impedance layers. As another example, the solid acoustic mirror 72 can include alternating silicon dioxide layers as low impedance layers and molybdenum layers as high impedance layers. The BAW device 70 is an example of a BAW solidly mounted resonator (SMR) device. Any suitable principles and advantages of disclosed herein can be applied in BAW SMR devices.

Figure 11:
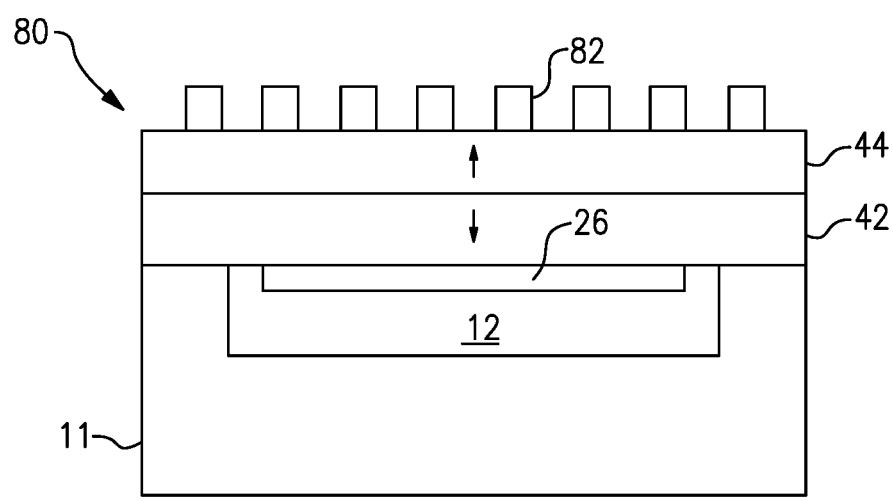
FIG. 11 is a cross sectional schematic diagram of a Lamb wave resonator with a plurality of stacked piezoelectric layers between electrodes according to an embodiment.

FIG. 11 is a cross sectional schematic diagram of a Lamb wave resonator 80 according to an embodiment. The Lamb wave resonator 80 has a cross section that is similar to the BAW device 10, except that (1) the Lamb wave resonator 80 includes an interdigital transducer electrode 82 in place of the second electrode 28 of the BAW device 10 and (2) the Lamb wave resonator 80 has a different air cavity 12 that is etched in the substrate 11. Any suitable principles and advantages of disclosed herein can be applied in Lamb wave resonators. The Lamb wave resonator 80 is one illustrative example.

BAW resonators disclosed herein can be implemented in various acoustic wave filters and packaged acoustic filter components. Example packaged acoustic filter components are described with reference to FIGS. 12, 14, and 17. Any suitable combination of features of these packaged acoustic filter components can be implemented together with each other. Example filter topologies are discussed with reference to FIGS. 13, 15, and 16. Any suitable combination of features of these filter topologies can be implemented together with each other. BAW devices in accordance with any suitable principles and advantages disclosed herein can be implemented with any suitable principles and advantages of the acoustic wave filters and packaged filter components disclosed herein. Improved power handling and linearity (e.g., suppression of second harmonic distortion) of these filters can be particularly useful in filters for higher power signals, such as transmit filters arranged to filter relatively high power radio frequency signals. The power handling and linearity of these features can contribute to meeting 5G NR technical specifications.

Figure 12:
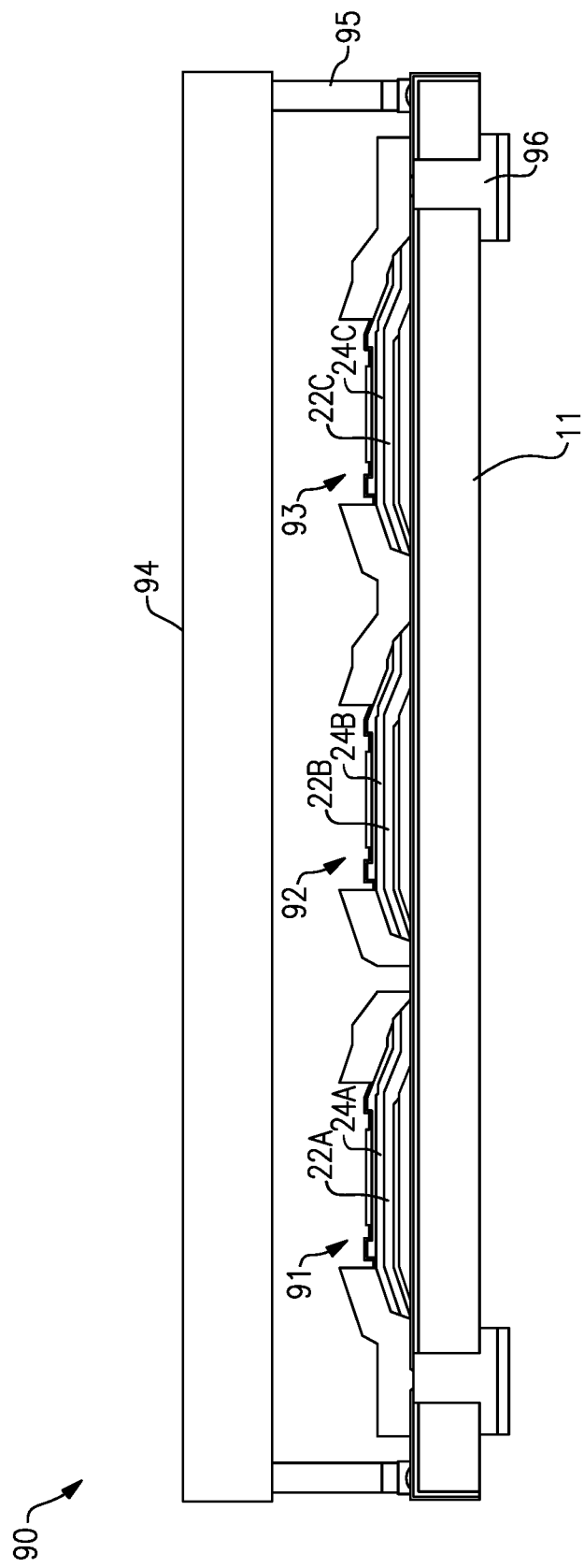
FIG. 12 is a schematic cross-sectional diagram of a packaged acoustic filter component that includes a plurality of overtone mode BAW resonators according to an embodiment.

FIG. 12 is a schematic cross-sectional diagram of a packaged acoustic filter component 90 that includes a plurality of overtone mode BAW resonators 91, 92, and 93 according to an embodiment. The overtone mode BAW resonators 91, 92, and 93 are each configured to excite an overtone mode as a main mode. The overtone mode BAW resonators 91, 92, and 93 can be implemented in accordance with any suitable principles and advantages disclosed herein. For example, each of the overtone mode BAW resonators 91, 92, and 93 can include stacked piezoelectric layers between a pair of electrodes, where adjacent piezoelectric layers in the stack have different c-axis orientations. As illustrated in FIG. 12, the overtone mode BAW resonator 91 includes stacked piezoelectric layers 22A and 24A, the overtone mode BAW resonator 92 includes stacked piezoelectric layers 22B and 24B, and the overtone mode BAW resonator 93 includes stacked piezoelectric layers 22C and 24C. The overtone mode BAW resonators 91, 92, and 93 are on a common substrate 11. The substrate 11 can be a silicon substrate.

The overtone mode BAW resonators 91, 92, and 93 can be electrically connected to each other within a package structure. The package structure can include a cap wafer 94 and a side wall 95. The cap wafer 94 can include a silicon substrate. The side wall 95 can include a conductive material. The overtone mode resonator 93 can be electrically connected to a contact of the packaged acoustic filter component 90 arranged as an input/output (I/O) port of the filter by way of a through substrate via 96. Similarly, the overtone mode resonator 91 can be electrically connected to another contact of the packaged acoustic filter component 90 arranged as another I/O port of the filter by way of another through substrate via.

Although three overtone mode BAW resonators 91, 92, and 93 are shown in the cross-sectional diagram of FIG. 12, the packaged acoustic filter component 90 can include any suitable number of overtone mode BAW resonators. In certain applications, the overtone mode BAW resonators 91, 92, and 93 can be included in a single filter. According to some other applications, the overtone mode BAW resonators 91, 92, and 93 can be included in two or more filters. For example, the overtone mode BAW resonators 91, 92, and 93 can be included in two or more filters of a multiplexer, such as a duplexer.

Figure 13:
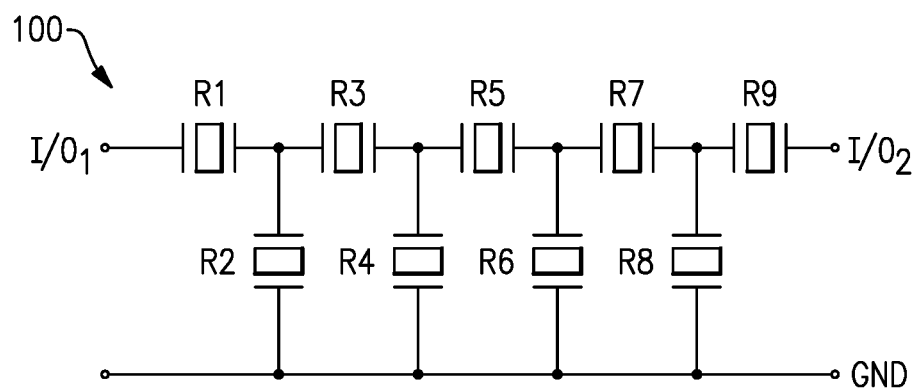
FIG. 13 is a schematic diagram of a ladder filter that includes overtone mode BAW resonators according to an embodiment.

FIG. 13 is a schematic diagram of a ladder filter 100 that includes BAW resonators according to an embodiment. All acoustic resonators of the ladder filter 100 are overtone mode BAW resonators. The ladder filter 100 can be implemented in higher power applications where the overtone mode BAW resonators provide desirable power handling characteristics. The ladder filter 100 can be a transmit filter. The ladder filter 100 can be implemented in higher frequency filtering applications (e.g., filtering RF signal with a frequency of over 5 GHz). The ladder filter 100 can have a passband in a frequency range from 5 GHz to 12 GHz. The ladder filter 100 can have a passband in a frequency range from 5 GHz to an upper end of FR1. The ladder filter 100 can have a passband in a frequency range from 5 GHz to 20 GHz. The ladder filter 100 can be used in 5G NR applications. For example, the ladder filter 100 can be a band pass filter with a passband corresponding to a 5G NR operating band.

The ladder filter 100 can be implemented by a packaged acoustic filter component in accordance with any suitable principles and advantages discussed with reference to the packaged acoustic filter component 90 of FIG. 12. For example, resonator R1 can be implemented by the overtone BAW resonator 91 of FIG. 12, resonator R8 can be implemented by the overtone BAW resonator 92 of FIG. 12, and resonator R9 can be implemented by the overtone BAW resonator 93 of FIG. 12.

In certain applications, each BAW resonator in the ladder filter 100 can excite a second overtone mode as a main mode. In various applications, each BAW resonator in the ladder filter 100 can excite a third overtone mode as a main mode. In some applications, at least one BAW resonator in the ladder filter 100 can excite a second overtone mode as a main mode and at least one other BAW resonator can excite a third overtone mode as a main mode. One or more overtone mode BAW resonators of the ladder filter can excite a fourth or higher overtone mode as a main mode.

The ladder filter 100 is an example topology that can implement a band pass filter formed from acoustic wave resonators. In a band pass filter with a ladder filter topology, the shunt resonators can have lower resonant frequencies than the series resonators. The ladder filter 100 can be arranged to filter a radio frequency signal. As illustrated, the ladder filter 100 includes series BAW resonators R1 R3, R5, R7, R9 and shunt BAW resonators R2, R4, R6, and R8 coupled between a first input/output port $I/O_1$ and a second input/output port $I/O_2$. The shunt BAW resonators can be coupled between a node between two series BAW resonators and ground GND as illustrated. Any suitable number of series BAW resonators can be in included in a ladder filter. Any suitable number of shunt BAW resonators can be included in a ladder filter. The first input/output port $I/O_1$ can be a transmit port and the second input/output port $I/O_2$ can be an antenna port. Alternatively, first input/output port $I/O_1$ can be a receive port and the second input/output port $I/O_2$ can be an antenna port.

Figure 14:
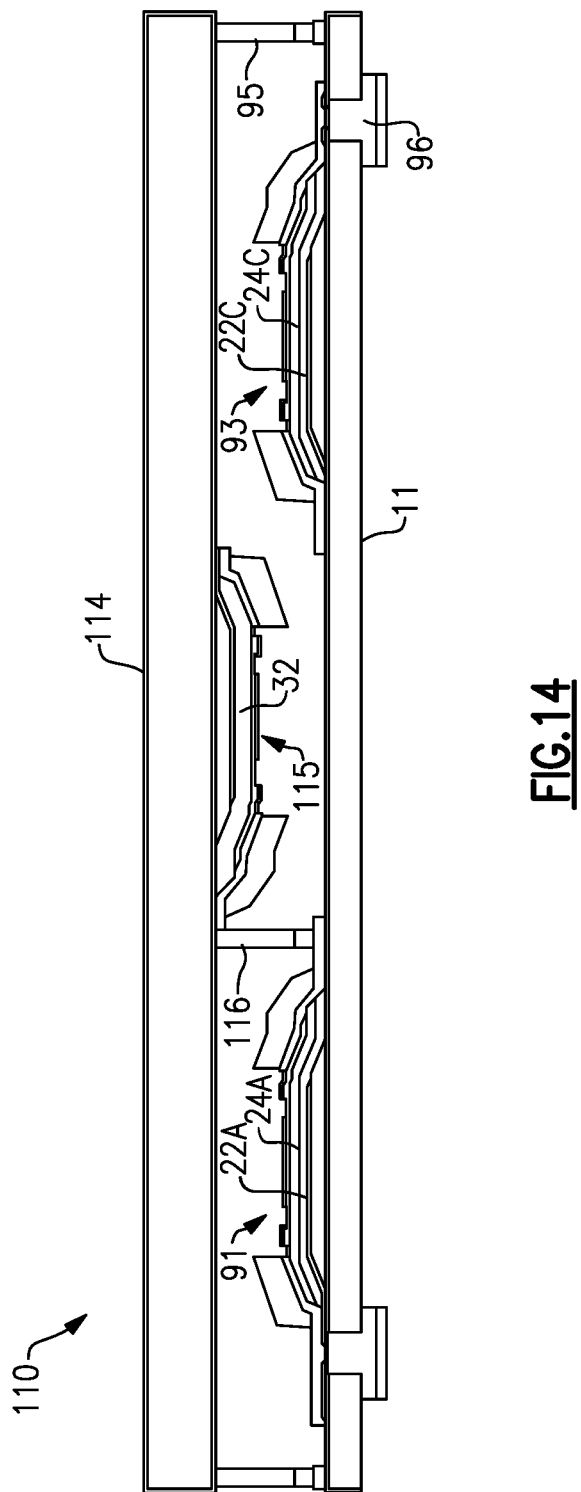
FIG. 14 is a schematic cross sectional diagram of a packaged acoustic filter component that includes a plurality of overtone mode BAW resonators and a fundamental mode BAW resonator according to an embodiment.

FIG. 14 is a schematic cross-sectional diagram of a packaged acoustic filter component 110 with that includes a plurality of overtone mode BAW resonators 91 and 93 and a fundamental mode BAW resonator 115 according to an embodiment. The packaged acoustic filter component 110 is an example of a component with overtone mode BAW resonators co-packaged with at least one fundamental mode BAW resonator. There is wafer level packaging for the packaged acoustic filter component 110.

The packaged acoustic filter component 110 includes stacked two stacked BAW die with active sides facing each other. A fundamental mode BAW die is stacked with and attached to an overtone mode BAW die. The overtone mode BAW die includes the overtone mode BAW resonators 91 and 93 on a first substrate 11. The fundamental mode BAW die includes a fundamental mode BAW resonator 115 on a second substrate 114. The second substrate 114 can be a silicon substrate, for example.

The fundamental mode BAW resonator 115 includes a single piezoelectric layer 32 positioned between a pair of electrodes. The stacked piezoelectric layers 22A and 24A can together be at least 1.5 times as thick as the single piezoelectric layer 32. The stacked piezoelectric layers 22A and 24A can together be at least 2 times as thick as the single piezoelectric layer 32. The fundamental mode BAW resonator 115 is configured to excite the fundamental mode as a main mode. The piezoelectric layer of the BAW resonator 115 is significantly thinner than the combined thickness of stacked piezoelectric layers 22A and 22B of the overtone mode BAW resonator 91. For example, the combined thickness of stacked piezoelectric layers 22A and 22B of the overtone mode BAW resonator 91 can be about twice the thickness of the piezoelectric layer 32 of the fundamental mode BAW resonator 115 in certain applications. Similarly, the piezoelectric layer 32 of the BAW resonator 115 is significantly thinner than the combined thickness of stacked piezoelectric layers 22C and 24C of the overtone mode BAW resonator 93.

In physical layout, overtone mode BAW resonators 91 and 93 with a second overtone mode as a respective main mode can each be roughly 4 times larger than the fundamental mode BAW resonator 115. The overtone mode BAW resonators 91 and 93 can have better power handling characteristics that the fundamental mode BAW resonator 115. The overtone mode BAW resonators 91 and 93 can have reduced harmonic distortion and/or better linearity compared to the fundamental mode BAW resonator 115.

As illustrated in FIG. 14, active sides of the substrates 11 and 114 face each other. The overtone mode BAW resonators 91 and 93 each include a piezoelectric and electrode stack on a side of the first substrate 11 that faces a side of the second substrate 114 on which a piezoelectric and electrode stack the fundamental mode BAW resonator 115 is positioned. The overtone mode BAW resonators 91 and 93 and the fundamental mode BAW resonator 115 are enclosed by a packaging structure. The overtone mode BAW resonators 91 and 93 and the fundamental mode BAW resonator 115 are enclosed by the first substrate 11, the second substrate 114, and sidewalls 95. The overtone mode BAW resonators 91 and 93 and the fundamental mode BAW resonator 115 are hermetically sealed together within a cavity in FIG. 14. The sidewalls 95 are included in a packaging structure that encloses the overtone mode BAW resonators 91 and 93 and the fundamental mode BAW resonator 115 in a sealed volume. As illustrated, the overtone mode BAW die and the fundamental mode BAW die are attached via the sidewalls 95.

An overtone mode BAW resonator and a fundamental mode BAW resonator can be electrically connected to each other within a package structure of the packaged acoustic filter component 110. A conductive pillar 116 can provide an electrical connection between the overtone mode BAW resonator 91 and the fundamental mode BAW resonator 115. The conductive pillar can be a copper pillar, for example. Any suitable number of electrical connections can be included between overtone mode BAW resonators and fundamental mode BAW resonators within a packaged structure of the packaged acoustic filter component 110.

Any suitable number of overtone mode BAW resonators can be included on the first substrate 11. For example, one or more additional overtone mode BAW resonators can be on the first substrate 11 of the packaged acoustic filter component 110 and positioned behind and/or in front of the illustrated overtone mode BAW resonators 91 and/or 93. Such BAW resonators can include a plurality of BAW resonators of an acoustic wave filter and/or BAW resonators of two or more acoustic wave filters.

Any suitable number of fundamental mode BAW resonators can be included on the second substrate 114. For example, one or more additional fundamental mode BAW resonators can be on the second substrate 114 can be positioned behind and/or in front of the fundamental mode BAW resonator 115. Such fundamental mode BAW resonators can include a plurality of fundamental mode BAW resonators of an acoustic wave filter and/or fundamental mode BAW resonators of two or more acoustic wave filters. Although not illustrated in FIG. 14, in certain instances, a fundamental mode BAW resonator and an overtone mode BAW resonator can overlap in vertical direction perpendicular to a planar surface of the substrate 11. This can reduce area consumed by a packaged acoustic filter component.

The overtone mode BAW resonators 91 and 93 and the fundamental mode BAW resonator 115 can be included in a single filter. In some other applications, the overtone mode BAW resonators and fundamental mode BAW resonators of a packaged acoustic filter component can be included in two or more filters. Such two or more filters can be included in a multiplexer, such as a duplexer.

Figure 15:
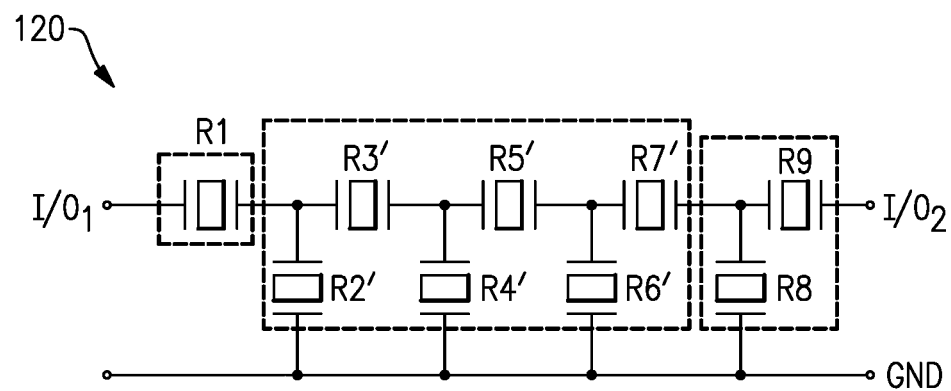
FIG. 15 is a schematic diagram of a ladder filter that includes overtone mode BAW resonators and fundamental mode BAW resonators according to an embodiment.

FIG. 15 is a schematic diagram of a ladder filter 120 that includes overtone mode BAW resonators and fundamental mode BAW resonators according to an embodiment. In the ladder filter 120, overtone mode resonators are implemented where they can have the largest impact on performance. Overtone mode BAW resonators can provide better power handling and linearity performance relative to fundamental mode BAW resonators. A first series resonator from an I/O port can have the largest impact on power handling. The first series resonator from the I/O port can have the largest impact on linearity. Accordingly, the first series resonator from the I/O port can be an overtone mode BAW resonator. Fundamental mode BAW resonators can be coupled to the I/O port by way of the first series overtone mode BAW resonator.

The ladder filter 120 can be implemented in higher power applications where the overtone mode BAW resonators provide desirable power handling characteristics. The ladder filter 120 can be a transmit filter. The ladder filter 120 can be implemented in higher frequency filtering applications (e.g., filtering RF signal with a frequency of over 5 GHz). The ladder filter 120 can have a passband in a frequency range from 5 GHz to 12 GHz, or in a frequency range from 5 GHz to 20 GHz. The ladder filter 120 can be used in 5G NR applications. For example, the ladder filter 120 can be a band pass filter with a passband corresponding to a 5G NR operating band.

The ladder filter 120 is like the ladder filter 100 of FIG. 13, except that the overtone mode BAW resonators R2, R3, R4, R5, R6, and R7 of the ladder filter 100 are replaced with fundamental mode BAW resonators R2', R3', R4', R5', R6', and R7' in the ladder filter 120. The overtone mode BAW resonators R1, R8, and R9 of the ladder filter 120 can have the largest impact on power handling and/or linearity in certain applications. In various applications, the overtone mode BAW resonator R1 can be the first series resonator from an antenna port, the overtone mode BAW resonator R9 can be the first series resonator from a transmit port, and the overtone mode BAW resonator R9 can be the first shunt resonator from the transmit port. In some applications, the overtone mode BAW resonator R1 can be the first series resonator from a transmit port, the overtone mode BAW resonator R9 can be the first series resonator from an antenna port, and the overtone mode BAW resonator R9 can be the first shunt resonator from the antenna port.

The ladder filter 120 can achieve sufficient power handling and linearity for certain applications with overtone mode BAW resonators R1, R8, and R9 and fundamental mode BAW resonators R2', R3', R4', R5', R6', and R7'. In the ladder filter 120, most of the acoustic resonators are fundamental mode BAW resonators. The ladder filter 120 includes fewer overtone mode BAW resonators than fundamental mode BAW resonators. Having some BAW resonators be fundamental mode resonators and other BAW resonators be overtone mode resonators can reduce a physical area of a filter relative to using all overtone mode BAW resonators because the fundamental mode BAW resonators can be smaller in physical size.

A first series fundamental mode BAW resonator from an I/O port (e.g., an antenna port) can be split into cascading BAW resonators to increase linearity in certain applications. With the first series resonator from the I/O port being an overtone mode BAW resonator, the reduced harmonic distortion and/or increased linearity of the overtone mode BAW resonator can provide sufficient performance such the BAW resonator can be implemented by a single series resonator without splitting. Accordingly, in embodiments disclosed herein, the first filter stage from an I/O port can include a single series overtone mode BAW resonator. In some instances, the first filter stage from the I/O port can also include at least one shunt acoustic resonator.

Figure 16:
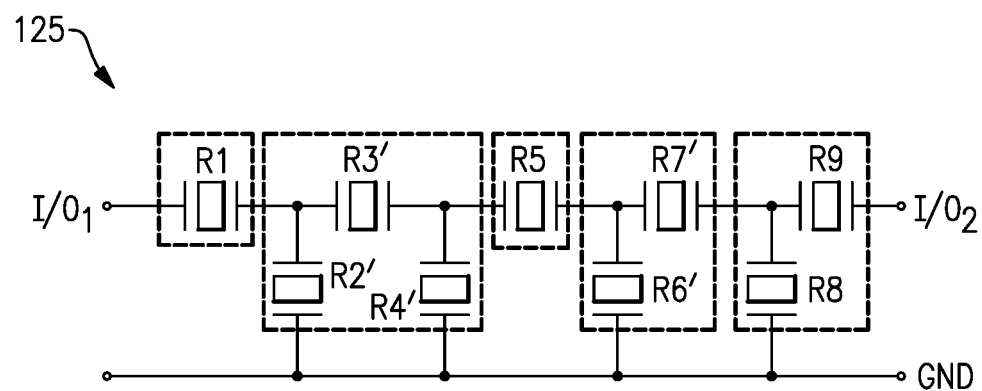
FIG. 16 is a schematic diagram of a ladder filter that includes overtone mode BAW resonators and fundamental mode BAW resonators according to an embodiment.

FIG. 16 is a schematic diagram of a ladder filter 125 that includes overtone mode BAW resonators and fundamental mode BAW resonators according to an embodiment. Any suitable resonator of a ladder filter can be an overtone mode BAW resonator for a particular application. Power dissipation analysis can used to determine which resonators of a ladder filter to implement as an overtone mode BAW resonator. Overtone mode BAW resonators can be implemented for the resonators in which a dissipated power level is higher (e.g., where dissipated power is above a certain threshold). For example, power dissipation analysis can determine to replace fundamental mode BAW resonator R5' from the ladder filter 120 of FIG. 15 with overtone mode BAW resonator R5 in the ladder filter 125. Any other fundamental mode BAW resonator of the ladder filter 120 can be alternatively or additionally be replaced with an overtone mode BAW resonator.

While some other embodiments related to filters that include an overtone mode BAW resonator and a fundamental mode BAW resonator, any suitable principles and advantages discussed herein can be implemented with two different suitable types of BAW resonators with one or more different characteristics. For instance, a filter can include a BAW resonators of a first type and a BAW resonators of a second type, where the BAW resonator of the first type has better power handling than the BAW resonator of the second type. The BAW resonator of the first type can also have better linearity than the BAW resonator of the second type. The BAW resonator of the first type can be implemented in an acoustic wave filter where more power handling is desired. The BAW resonator of the second type can be implemented in the filter topology in a location such that the acoustic wave filter still meets power handling specifications. An overtone mode BAW resonator is one example of the BAW resonator of the first type, and a fundamental mode BAW resonator is one example of the BAW resonator of the second type.

While some other embodiments related to filters that include an overtone mode BAW resonator and a fundamental mode BAW resonator, any suitable principles and advantages discussed herein can be implemented with other types of overtone mode resonators and fundamental mode resonators. For instance, a filter can include one or more surface acoustic wave overtone mode resonators and one or more surface acoustic wave fundamental mode resonators.

Figure 17:
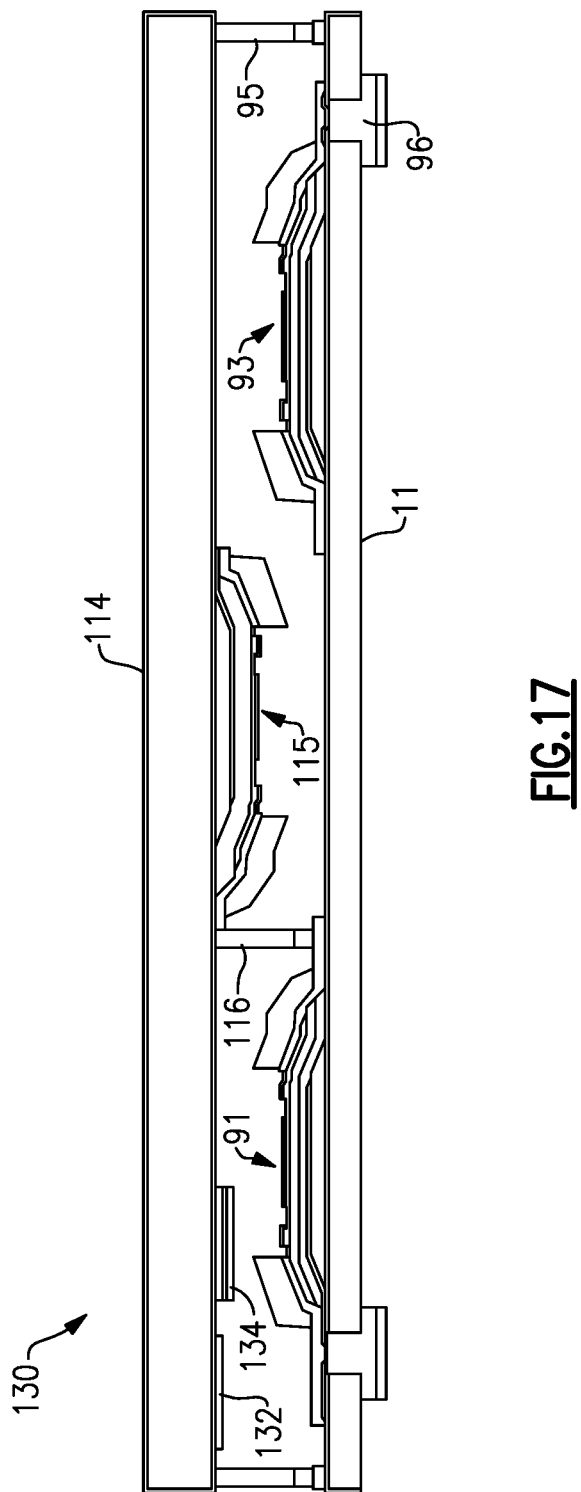
FIG. 17 is a schematic cross sectional diagram of a packaged acoustic filter component that includes a plurality of overtone mode BAW resonators, a fundamental mode BAW resonator, and integrated passive devices according to an embodiment.

FIG. 17 is a schematic cross-sectional diagram of a packaged acoustic filter component 130 that includes a plurality of overtone mode BAW resonators 91 and 93, a fundamental mode BAW resonator 115, and integrated passive devices (IPDs) 132 and 134 according to an embodiment. The packaged acoustic filter component 130 is like the packaged acoustic filter component 110 of FIG. 14, except that the packaged acoustic filter component 130 additionally includes the IPDs 132 and 134.

One or more other components can be included in packaged acoustic filter component together with the overtone mode BAW resonators 91 and 93 and the fundamental mode BAW resonator 115. Such other components can include an IPD inductor and/or an IPD capacitor. An IPD can be in series with a shunt resonator of a ladder filter. An IPD can be in parallel with a shunt resonator of a ladder filter. An IPD can be in series with a series resonator of a ladder filter. An IPD can be in parallel with a series resonator of a ladder filter. IPDs can provide more design freedom to tune and/or optimize performance of an acoustic wave filter. Example circuits with one or more IPDs and a BAW resonator are discussed with reference to FIGS. 18A to 18H.

As illustrated, an IPD inductor 132 is included in the packaged acoustic filter component 130. The IPD inductor 132 can be a conductive spiral on the second substrate 114. The IPD inductor 132 can be coupled between a shunt BAW resonator and ground. One or more additional IPD inductors can be implemented on the second substrate 114. Alternatively or additionally, one or more IPD inductors can be implemented on the first substrate 11. An IPD inductor can be implemented on an active side of a substrate and/or on a back side of a substrate opposite the active side. An IPD inductor can be implemented within a package structure. For example, the IPD inductor 132 is located within a package structure. An IPD inductor can be implemented outside of a package structure.

As illustrated, an IPD capacitor 134 is included in the packaged acoustic filter component 130. One or more additional IPD capacitors can be implemented on the second substrate 114. Alternatively or additionally, one or more IPD capacitors can be implemented on the first substrate 11. One or more IPD capacitors can be implemented on an active side of a substrate and/or on a back side of a substrate opposite the active side. An IPD capacitor can be implemented within a package structure. For example, the IPD capacitor 134 is located within a package structure. An IPD capacitor can be implemented outside of a package structure. IPDs can be implemented with a filter that includes overtone mode BAW resonators and fundamental mode BAW resonators. IPDs can be implemented with a filter where all BAW resonators are overtone mode BAW resonators.

The IPD inductor 132 and/or the IPD capacitor 134 can be implemented in a filter with a BAW component and an inductor-capacitor component. More details regarding examples of such filters are discussed with reference to FIG. 19.

FIGS. 18A to 18F are schematic diagrams of a BAW resonator and at least one passive component according to embodiments. The passive component can tune performance of the BAW resonator. The BAW resonator can be an overtone mode BAW resonator. Alternatively, the BAW resonator can be a fundamental mode BAW resonator. The BAW resonator can be a series BAW resonator or a shunt BAW resonator in a filter. An IPD of a packaged acoustic filter component can implement any of the passive impedance elements of FIGS. 18A to 18F. For example, the IPD inductor 132 of FIG. 17 can implement any inductor of these figures. As another example, the IPD capacitor 134 of FIG. 17 can implement any capacitor of these figures. Any of the circuits of FIGS. 18A to 18H can be implemented where a single BAW resonator is illustrated in any of the acoustic filters disclosed herein, such as any of the filters of FIG. 13, 15, 16, 20, or 21.

FIG. 18A illustrates a circuit 140 that includes a capacitor C in parallel with a BAW resonator R. FIG. 18B illustrates a circuit 141 that includes an inductor L in parallel with a BAW resonator R. FIG. 18C illustrates a circuit 142 that includes a capacitor C in series with a BAW resonator R. FIG. 18D illustrates a circuit 143 that includes an inductor L in series with a BAW resonator R. The circuit 143 can implement a shunt BAW resonator R connected to ground by a shunt inductor L in certain applications. FIG. 18E illustrates a circuit 144 that includes a series combination of a capacitor C and an inductor L in parallel with a BAW resonator R. FIG. 18F illustrates a circuit 145 that includes a parallel combination of a capacitor C and an inductor L in parallel with a BAW resonator R. FIG. 18G illustrates a circuit 146 that includes a series combination of a capacitor C and an inductor L in series with a BAW resonator R. FIG. 18H illustrates a circuit 147 that includes a parallel combination of a capacitor C and an inductor L in series with a BAW resonator R.

FIG. 19 is a schematic block diagram of a filter 148 with an inductor-capacitor component 149 and a BAW component 150 according to an embodiment. The filter 148 is a hybrid acoustic inductor-capacitor filter. The BAW component 150 can be implemented in accordance with any suitable principles and advantages disclosed herein. The BAW component 150 can include one or more overtone mode BAW resonators. The BAW component 150 can also include one or more fundamental mode BAW resonators in some applications. The inductor-capacitor component 149 can include one or more inductors and one or more capacitors. The inductor-capacitor component 149 can include one or more IPD of a packaged acoustic filter component. For example, the inductor-capacitor component 149 can include the IPD inductor 132 and the IPD capacitor 134 in certain applications. The inductor-capacitor component 149 can alternatively or additionally include one or more surface mounted components, one or more passive devices implemented on a packaging substrate, or any suitable combination thereof.

In embodiments of the filter 148, the BAW component 150 can include at least one BAW resonator that forms either a lower or higher skirt of a band pass or band rejection filter, and the other filter skirt is formed by the inductor-capacitor component. In certain applications, a BAW component 150 can include BAW resonators that form a lower and higher skirt of a band pass (or band rejection filter), and the passband (or stop band) is set by the inductor-capacitor component. According to various applications, the filter 148 can be a pure pass filter arranged to pass frequencies except frequencies within one or more elimination bands. A pure pass filter can be referred to as a band elimination filter. One or more BAW resonators of the BAW component 150 can form a notch in frequency response of the filter 148.

A bulk acoustic wave resonator disclosed herein can be arranged as a series resonator in a ladder filter to contribute to a lower frequency edge of a pass band of a band pass filter. A bulk acoustic wave resonator disclosed herein can be arranged as a series resonator in a ladder filter to contribute to an upper frequency edge of a pass band of a band pass filter. In an embodiment, a ladder filter can include a shunt resonator in accordance with any suitable principles and advantages disclosed herein and a series resonator in accordance with any suitable principles and advantages disclosed herein.

Bulk acoustic wave devices disclosed herein can be implemented as bulk acoustic wave resonators in a variety of filters. Such filters can be arranged to filter a radio frequency signal. While some example ladder filter topologies are discussed above, bulk acoustic wave devices disclosed herein can be implemented in a variety of different filter topologies. Examples of other filter topologies include without limitation, lattice filters, hybrid ladder lattice filters, notch filters where a notch is created by a BAW resonator, hybrid acoustic and non-acoustic inductor-capacitor filters, and the like. The example filter topologies can implement band pass filters. The example filter topologies can implement band stop filters. In some instances, bulk acoustic wave devices disclosed herein can be implemented in filters with one or more other types of resonators and/or with passive impedance elements, such as one or more inductors and/or one or more capacitors. Some example filter topologies will now be discussed with reference to FIGS. 20 and 21. Any suitable combination of features of the filter topologies of FIGS. 20 to 21 can be implemented together with each other and/or with other filter topologies.

Figure 20:
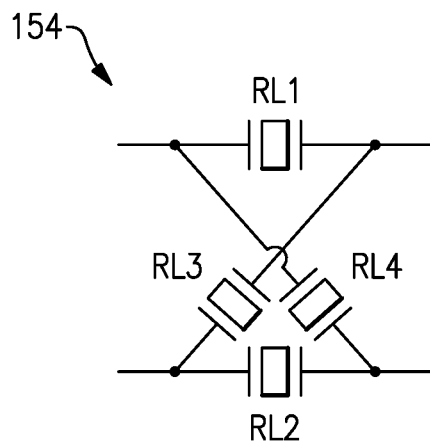
FIG. 20 is a schematic diagram of a lattice filter that includes a bulk acoustic wave resonator according to an embodiment.

FIG. 20 is a schematic diagram of a lattice filter 154 that includes a bulk acoustic wave resonator according to an embodiment. The lattice filter 154 is an example topology that can form a band pass filter from acoustic wave resonators. The lattice filter 154 can be arranged to filter an RF signal. As illustrated, the lattice filter 154 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 154 has a balanced input and a balanced output. One or more of the illustrated acoustic wave resonators RL1 to RL4 can be a bulk acoustic wave resonator in accordance with any suitable principles and advantages disclosed herein.

Figure 21:
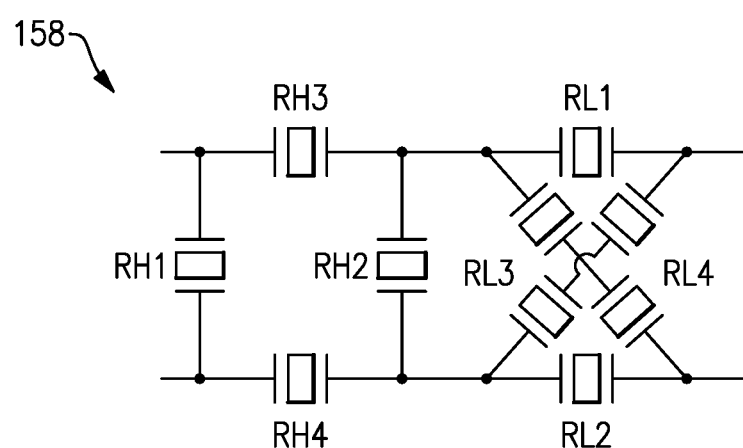
FIG. 21 is a schematic diagram of a hybrid ladder lattice filter that includes a bulk acoustic wave resonator according to an embodiment.

FIG. 21 is a schematic diagram of a hybrid ladder and lattice filter 158 that includes a bulk acoustic wave resonator according to an embodiment. The illustrated hybrid ladder and lattice filter 158 includes series acoustic resonators RL1, RL2, RH3, and RH4 and shunt acoustic resonators RL3, RL4, RH1, and RH2. The hybrid ladder and lattice filter 158 includes one or more bulk acoustic wave resonators in accordance with any suitable principles and advantages disclosed herein.

According to certain applications, a bulk acoustic wave resonator can be included in filter that also includes one or more inductors and one or more capacitors. Such filters can include one or more circuits of FIGS. 18A to 18F and/or the inductor-capacitor component 149 of FIG. 19.

One or more bulk acoustic wave resonators including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more BAW resonators disclosed herein. FR1 can be from 410 megahertz (MHz) to 7.125 gigahertz (GHz), for example, as specified in a current 5G NR specification. A filter with BAW devices disclosed herein can provide desirable power handling and/or linearity for 5G NR applications. A filter with BAW devices disclosed herein can provide filtering of relatively high frequency signals for 5G NR applications. One or more bulk acoustic wave resonators in accordance with any suitable principles and advantages disclosed herein can be included in a filter arranged to filter a radio frequency signal in a fourth generation (4G) Long Term Evolution (LTE) operating band. One or more acoustic wave resonators in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application. One or more bulk acoustic wave resonators in accordance with any suitable principles and advantages disclosed herein can be included in an acoustic wave filter for high frequency bands, such as frequency bands above 5 GHz and/or frequency bands above 5 GHz within FR1. BAW devices disclosed herein can be implemented in transmit filters, which typically have higher power handling specifications than receive filters.

The bulk acoustic wave resonators disclosed herein can be implemented in a standalone filter and/or in a filter in any suitable multiplexer. Such filters can be any suitable topology, such as any filter topology of FIGS. 13, 15, 16, 19, 20, and 21. The filter can be a band pass filter arranged to filter a 4G LTE band and/or 5G NR band. Examples of a stand-alone filter and multiplexers will be discussed with reference to FIGS. 22A to 22E. Any suitable principles and advantages of these filters and/or multiplexers can be implemented together with each other.

Figure 22A:
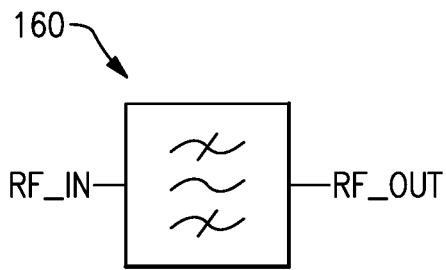
FIG. 22A is a schematic diagram of an acoustic wave filter.

FIG. 22A is schematic diagram of an acoustic wave filter 160. The acoustic wave filter 160 is a band pass filter. The acoustic wave filter 160 is arranged to filter a radio frequency signal. The acoustic wave filter 160 includes one or more acoustic wave devices coupled between a first input/output port RF_IN and a second input/output port RF_OUT. The acoustic wave filter 160 includes a bulk acoustic wave resonator according to an embodiment.

Figure 22B:
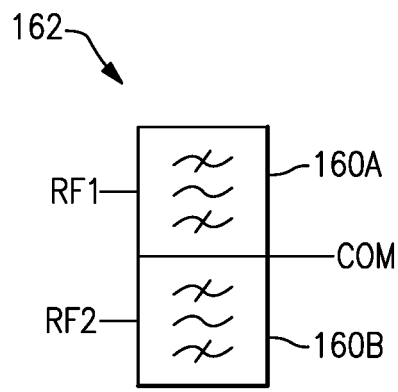
FIG. 22B is a schematic diagram of a duplexer.

FIG. 22B is a schematic diagram of a duplexer 162 that includes an acoustic wave filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A includes one or more acoustic wave resonators coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein.

The second filter 160B can be any suitable filter arranged to filter a second radio frequency signal. The second filter 160B can be, for example, an acoustic wave filter, an acoustic wave filter that includes a bulk acoustic wave resonator in accordance with any suitable principles and advantages disclosed herein, an LC filter, a hybrid acoustic wave LC filter, or the like. The second filter 160B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of bulk acoustic wave devices in accordance with any suitable principles and advantages disclosed herein.

Figure 22C:
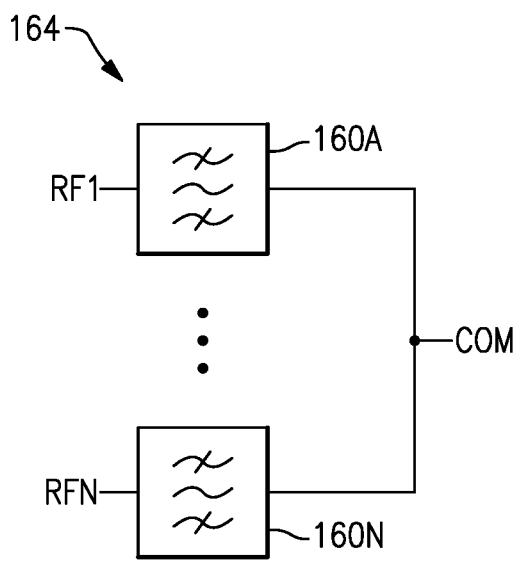
FIG. 22C is a schematic diagram of a multiplexer with hard multiplexing.

FIG. 22C is a schematic diagram of a multiplexer 164 that includes an acoustic wave filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include one or more acoustic wave devices coupled between a first radio frequency node RF1 and the common node COM. The first radio frequency node RF1 can be a transmit node or a receive node. The first filter 160A includes a bulk acoustic wave resonator in accordance with any suitable principles and advantages disclosed herein. The other filter(s) of the multiplexer 164 can include one or more acoustic wave filters, one or more acoustic wave filters that include a bulk acoustic wave resonator in accordance with any suitable principles and advantages disclosed herein, one or more LC filters, one or more hybrid acoustic wave LC filters, the like, or any suitable combination thereof.

Figure 22D:
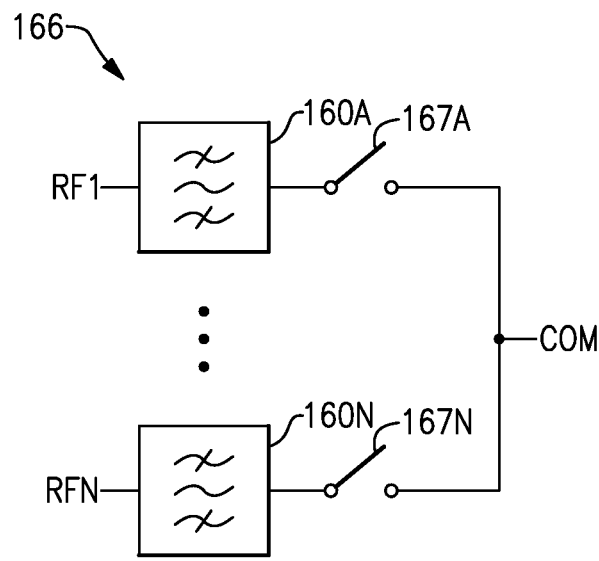
FIG. 22D is a schematic diagram of a multiplexer with switched multiplexing.

FIG. 22D is a schematic diagram of a multiplexer 166 that includes an acoustic wave filter according to an embodiment. The multiplexer 166 is like the multiplexer 164 of FIG. 22C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filter 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 22E:
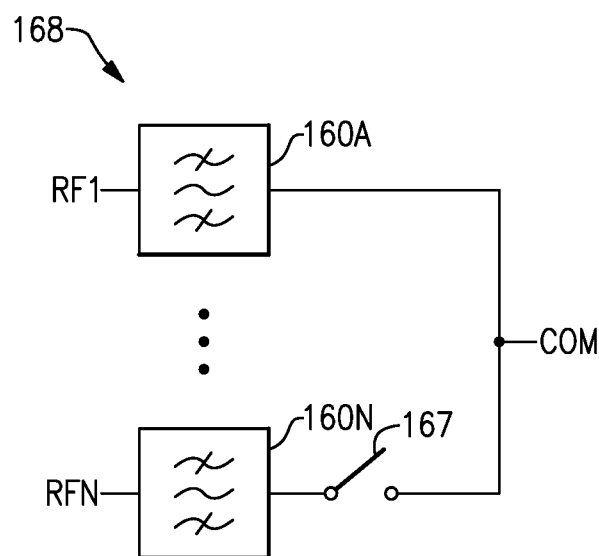
FIG. 22E is a schematic diagram of a multiplexer with a combination of hard multiplexing and switched multiplexing.

FIG. 22E is a schematic diagram of a multiplexer 168 that includes an acoustic wave filter according to an embodiment. The multiplexer 168 illustrates that a multiplexer can include any suitable combination of hard multiplexed and switched multiplexed filters. One or more bulk acoustic wave devices in accordance with any suitable principles and advantages disclosed herein can be included in a filter (e.g., the filter 160A) that is hard multiplexed to the common node COM of the multiplexer 168. Alternatively or additionally, one or more bulk acoustic wave devices in accordance with any suitable principles and advantages disclosed herein can be included in a filter (e.g., the filter 160N) that is switch multiplexed to the common node COM of the multiplexer 168.

The acoustic wave devices disclosed herein can be implemented in a variety of packaged modules. Some example packaged modules will now be disclosed in which any suitable principles and advantages of the acoustic wave devices, acoustic wave filters, or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 23 to 27 are schematic block diagrams of illustrative packaged modules according to certain embodiments. Any suitable combination of features of these packaged modules can be implemented with each other. While duplexers are illustrated in the example packaged modules of FIGS. 24, 25, and 27, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 23:
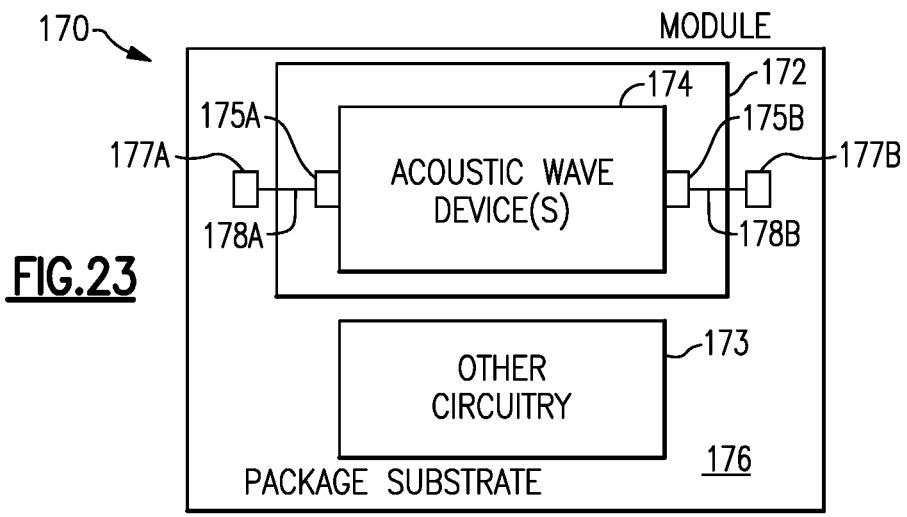
FIG. 23 is a schematic diagram of a radio frequency module that includes an acoustic wave filter according to an embodiment.

FIG. 23 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include an acoustic wave filter that includes a plurality of bulk acoustic wave resonators, for example.

The acoustic wave component 172 shown in FIG. 23 includes one or more acoustic wave devices 174 and terminals 175A and 175B. The one or more acoustic wave devices 174 include at least one bulk acoustic wave device implemented in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 23. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

Figure 24:
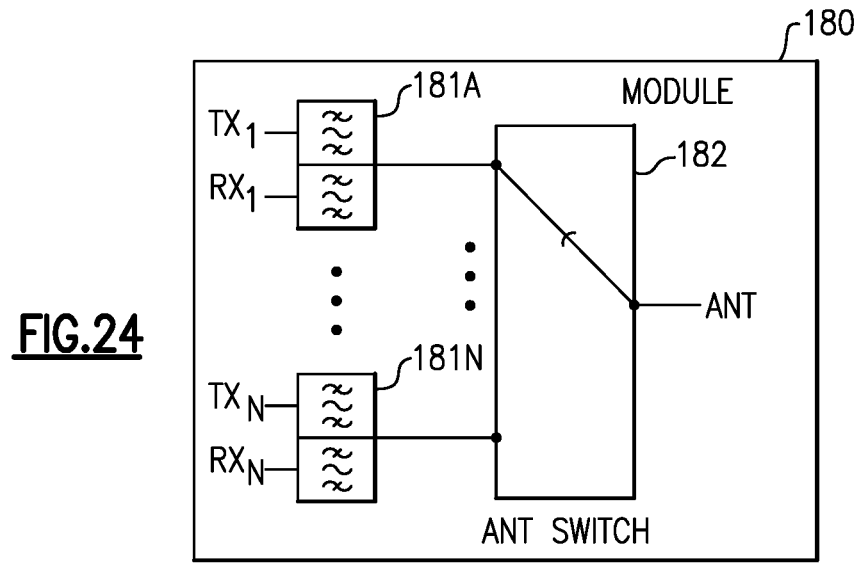
FIG. 24 is a schematic block diagram of a module that includes an antenna switch and duplexers according to an embodiment.

FIG. 24 is a schematic block diagram of a module 180 that includes duplexers 181A to 181N and an antenna switch 182. One or more filters of the duplexers 181A to 181N can include a bulk acoustic wave device in accordance with any suitable principles and advantages disclosed herein. Any suitable number of duplexers 181A to 181N can be implemented. The antenna switch 182 can have a number of throws corresponding to the number of duplexers 181A to 181N. The antenna switch 182 can include one or more additional throws coupled to one or more filters external to the module 180 and/or coupled to other circuitry. The antenna switch 182 can electrically couple a selected duplexer to an antenna port of the module 180.

Figure 25:
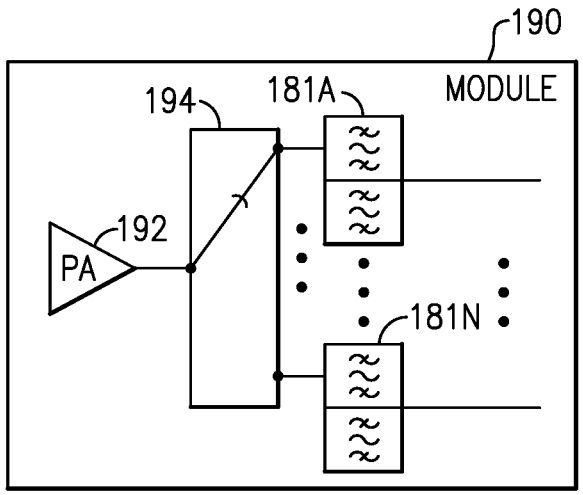
FIG. 25 is a schematic block diagram of a module that includes a power amplifier, a radio frequency switch, and duplexers according to an embodiment.

FIG. 25 is a schematic block diagram of a module 190 that includes a power amplifier 192, a radio frequency switch 194, and duplexers 181A to 181N according to an embodiment. The power amplifier 192 can amplify a radio frequency signal. The radio frequency switch 194 can be a multi-throw radio frequency switch. The radio frequency switch 194 can electrically couple an output of the power amplifier 192 to a selected transmit filter of the duplexers 181A to 181N. One or more filters of the duplexers 181A to 181N can include a bulk acoustic wave device in accordance with any suitable principles and advantages disclosed herein. Any suitable number of duplexers 181A to 181N can be implemented.

Figure 26:
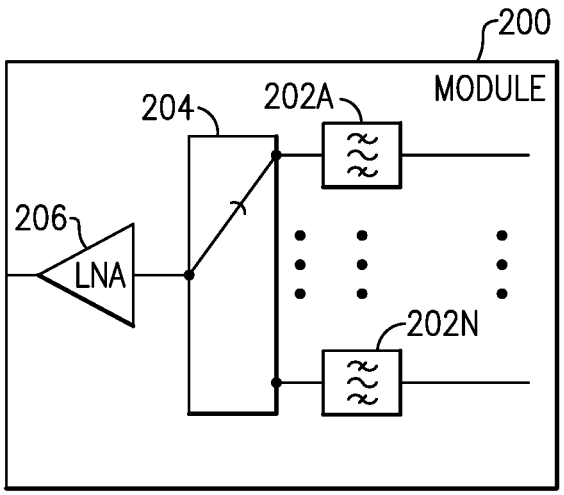
FIG. 26 is a schematic block diagram of a module that includes a low noise amplifier, a radio frequency switch, and filters according to an embodiment.

FIG. 26 is a schematic block diagram of a module 200 that includes filters 202A to 202N, a radio frequency switch 204, and a low noise amplifier 206 according to an embodiment. One or more filters of the filters 202A to 202N can include any suitable number of bulk acoustic wave devices in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

Figure 27:
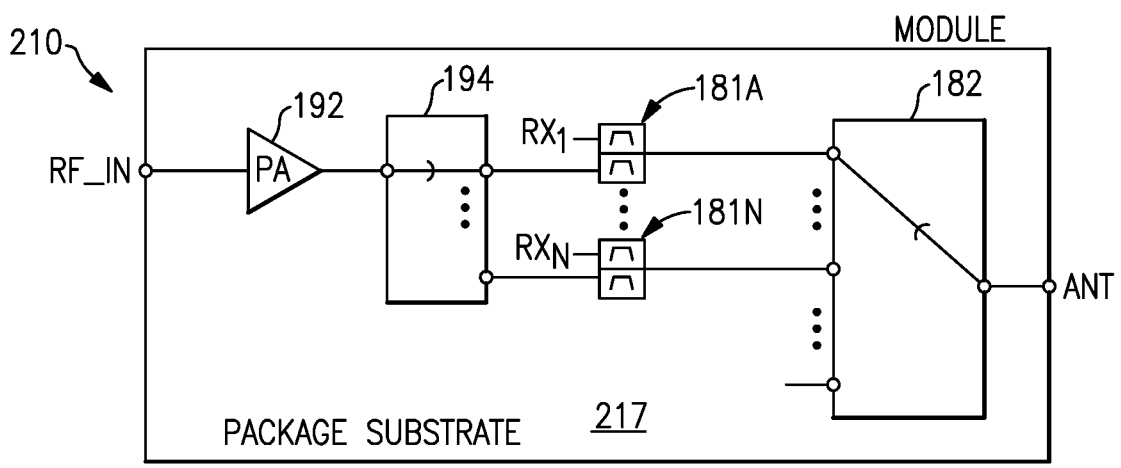
FIG. 27 is a schematic diagram of a radio frequency module that includes an acoustic wave filter according to an embodiment.

FIG. 27 is a schematic diagram of a radio frequency module 210 that includes an acoustic wave filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 27 and/or additional elements. The radio frequency module 210 may include any one of the acoustic wave filters that include at least one bulk acoustic wave resonator in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include a bulk acoustic wave device in accordance with any suitable principles and advantages disclosed herein. Similarly, one or more of the receive filters can include a bulk acoustic wave device in accordance with any suitable principles and advantages disclosed herein. Although FIG. 27 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 28:
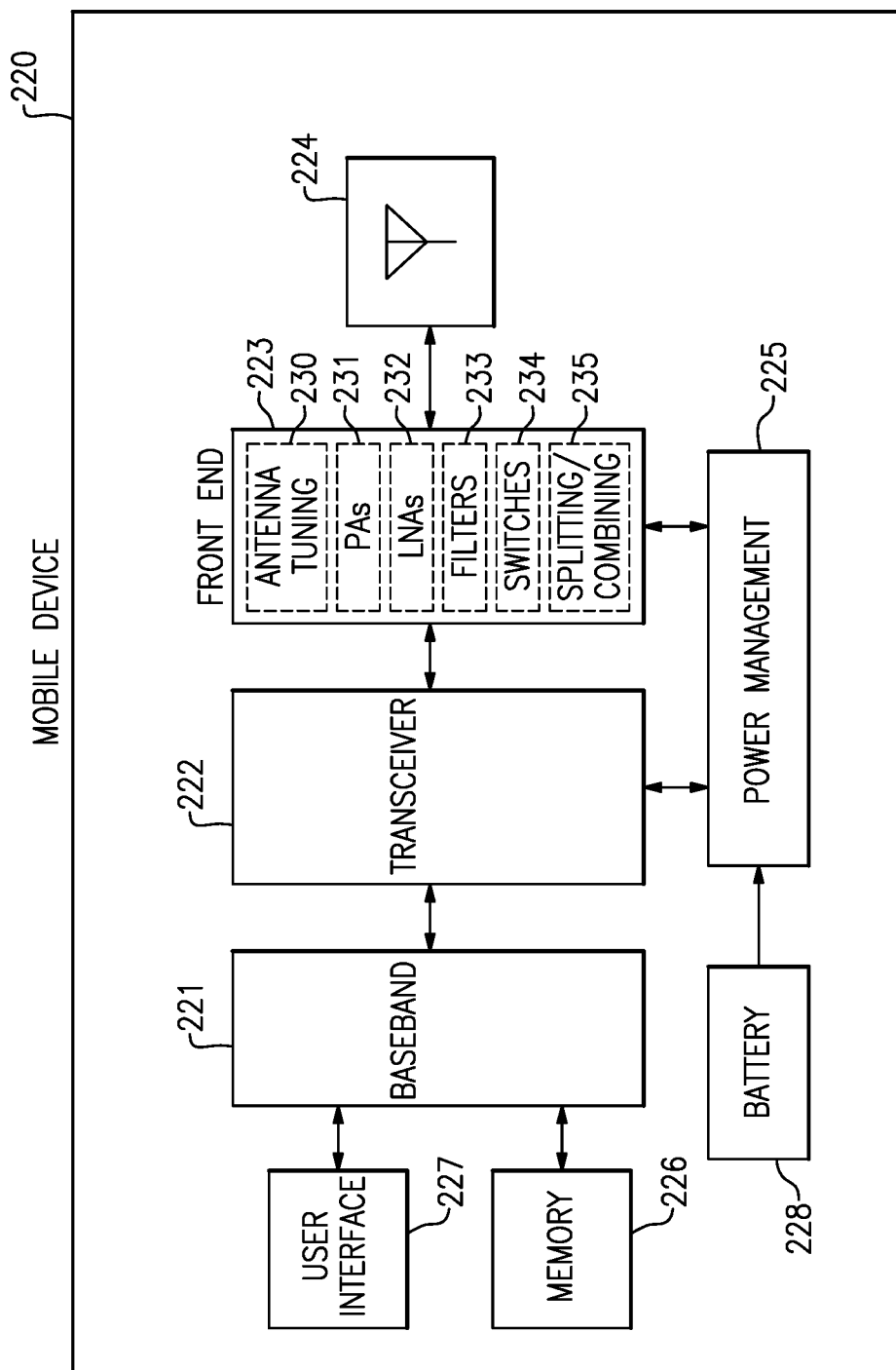
FIG. 28 is a schematic block diagram of a wireless communication device that includes a filter according to an embodiment.

The bulk acoustic wave devices disclosed herein can be implemented in wireless communication devices. FIG. 28 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 28 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters that include any suitable number of bulk acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (110), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 28, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 28, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz or in a frequency range from 5 GHz to 20 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter with overtone mode bulk acoustic wave resonators, the acoustic wave filter comprising:
   a first bulk acoustic wave resonator including a first plurality of stacked piezoelectric layers positioned between a pair of first electrodes, the first bulk acoustic wave resonator configured to excite an overtone mode as a main mode of the first bulk acoustic wave resonator; and
   a second bulk acoustic wave resonator including a second plurality of stacked piezoelectric layers positioned between a pair of second electrodes, the second bulk acoustic wave resonator configured to excite the overtone mode as a main mode of the second bulk acoustic wave resonator, the second bulk acoustic wave resonator coupled to the first bulk acoustic wave resonator, and the acoustic wave filter configured to filter a radio frequency signal.

2. The acoustic wave filter of claim 1 wherein all bulk acoustic wave resonators of the acoustic wave filter are configured to excite the overtone mode as a respective main mode.

3. The acoustic wave filter of claim 1 wherein the first and second bulk acoustic wave resonators are on a common substrate, the first and second bulk acoustic wave resonators are enclosed within a packaging structure, and the packaging structure includes a cap wafer positioned over the first and second bulk acoustic wave resonators.

4. The acoustic wave filter of claim 1 further comprising a third bulk acoustic wave resonator, the first and second bulk acoustic wave resonators being on a side of a first substrate, the third bulk acoustic wave resonator being on a side of a second substrate, the side of the first substrate facing the side of the second substrate, and the first, second, and third bulk acoustic wave resonators being co-packaged with each other.

5. The acoustic wave filter of claim 4 wherein the third bulk acoustic wave resonator includes a single piezoelectric layer.

6. The acoustic wave filter of claim 4 wherein the third bulk acoustic wave resonator is electrically connected to the first bulk acoustic wave resonator by way of a conductive pillar.

7. The acoustic wave filter of claim 1 further comprising an integrated passive device inductor co-packaged with the first and second bulk acoustic wave resonators, the integrated passive device inductor being electrically connected to the first bulk acoustic wave resonator.

8. The acoustic wave filter of claim 1 further comprising an integrated passive device capacitor co-packaged with the first and second bulk acoustic wave resonators, the integrated passive device capacitor being electrically connected to the first bulk acoustic wave resonator.

9. The acoustic wave filter of claim 1 wherein the first plurality of stacked piezoelectric layers includes first piezoelectric layer having a first c-axis and a second piezoelectric layer having a second c-axis, and the first c-axis and the second c-axis are oriented in substantially opposite directions.

10. The acoustic wave filter of claim 1 wherein the first plurality of stacked piezoelectric layers have a combined thickness in a range from 0.2 micrometer to 5 micrometers.

11. The acoustic wave filter of claim 1 wherein the first bulk acoustic wave resonator includes a raised frame structure.

12. The acoustic wave filter of claim 11 wherein the first bulk acoustic wave resonator includes a recessed frame structure.

13. The acoustic wave filter of claim 1 wherein a resonant frequency of the overtone mode of the first bulk acoustic wave resonator is in a range from 5 gigahertz to 12 gigahertz.

14. The acoustic wave filter of claim 1 wherein the acoustic wave filter is a band pass filter having a passband corresponding to a fifth generation New Radio operating band.

15. The acoustic wave filter of claim 1 wherein the overtone mode is a second overtone mode.

16. The acoustic wave filter of claim 1 wherein the overtone mode is a third overtone mode.

17. The acoustic wave filter of claim 1 wherein the first bulk acoustic wave resonator includes an air cavity over a substrate.

18. The acoustic wave filter of claim 1 wherein the acoustic wave filter is a transmit filter.

19. A radio frequency module comprising: the acoustic wave filter of claim 1; and
   a radio frequency circuit element coupled to the acoustic wave filter, the acoustic wave filter and the radio frequency circuit element being enclosed within a common package.

20. A wireless communication device comprising:
   the acoustic wave filter of claim 1;
   an antenna operatively coupled to the acoustic wave filter;

a radio frequency amplifier operatively coupled to the acoustic wave filter and configured to amplify a radio frequency signal; and
a transceiver in communication with the radio frequency amplifier.

* * * * *